(12) United States Patent
Abe et al.

(10) Patent No.: US 11,355,734 B2
(45) Date of Patent: Jun. 7, 2022

(54) ORGANIC PHOTOELECTRONIC ELEMENT COMPRISING FLUORINATED POLYMER

(71) Applicants: AGC Inc., Chiyoda-ku (JP); National University Corporation Yamagata University, Yamagata (JP)

(72) Inventors: Takefumi Abe, Chiyoda-ku (JP); Yasuhiro Kuwana, Chiyoda-ku (JP); Shigeki Hattori, Chiyoda-ku (JP); Kaori Tsuruoka, Chiyoda-ku (JP); Daisuke Yokoyama, Yonezawa (JP)

(73) Assignees: AGC Inc., Chiyoda-ku (JP); National University Corporation Yamagata University, Yamagata (JP)

( * ) Notice: Subject to any disclaimer, the term of this patent is extended or adjusted under 35 U.S.C. 154(b) by 152 days.

(21) Appl. No.: 16/779,719

(22) Filed: Feb. 3, 2020

(65) Prior Publication Data
US 2020/0176715 A1 Jun. 4, 2020

Related U.S. Application Data

(63) Continuation of application No. PCT/JP2018/031241, filed on Aug. 23, 2018.

(30) Foreign Application Priority Data

Aug. 24, 2017 (JP) ............... JP2017-161642

(51) Int. Cl.
H01L 51/52 (2006.01)
H01L 51/00 (2006.01)
H01L 51/50 (2006.01)

(52) U.S. Cl.
CPC ........ H01L 51/5265 (2013.01); H01L 51/004 (2013.01); H01L 51/5004 (2013.01);
(Continued)

(58) Field of Classification Search
None
See application file for complete search history.

(56) References Cited

U.S. PATENT DOCUMENTS

| 2011/0121338 A1* | 5/2011 | Son ............... C08G 61/122 |
| | | 257/98 |
| 2017/0183439 A1* | 6/2017 | Korai ............ C08F 226/12 |
| 2017/0369727 A1* | 12/2017 | De Campo ...... C09D 11/106 |

FOREIGN PATENT DOCUMENTS

| JP | 2005-38634 | 2/2005 |
| JP | 2006-237083 A | 9/2006 |

(Continued)

OTHER PUBLICATIONS

International Search Report dated Nov. 27, 2018 in PCT/JP2018/031241 filed Aug. 23, 2018, 2 pages.

(Continued)

*Primary Examiner* — Daniel Whalen
(74) *Attorney, Agent, or Firm* — Oblon, McClelland, Maier & Neustadt, L.L.P.

(57) ABSTRACT

To provide an organic photoelectronic element, of which the external quantum efficiency is improved, the power consumption is low and the service life is prolonged. The organic photoelectronic element comprises a substrate, an anode provided on the substrate, a cathode facing the anode, a light emitting layer disposed between the anode and the cathode, and a hole transport layer provided in contact with the light emitting layer between the light emitting layer and the anode, wherein the hole transport layer contains an organic semiconductor material and a fluorinated polymer, and at the surface of the hole transport layer in contact with the light emitting layer, the fluorinated polymer is present.

13 Claims, 4 Drawing Sheets

(52) U.S. Cl.
CPC ...... *H01L 51/5056* (2013.01); *H01L 51/5072* (2013.01); *H01L 51/5088* (2013.01); *H01L 51/5092* (2013.01); *H01L 51/001* (2013.01)

(56) References Cited

FOREIGN PATENT DOCUMENTS

| | | |
|---|---|---|
| JP | 2010-21422 A | 1/2010 |
| JP | 2015-97236 | 5/2015 |
| WO | WO 2013/031662 A1 | 3/2013 |
| WO | WO 2013/108618 A1 | 7/2013 |
| WO | WO 2016/100313 A1 | 6/2016 |
| WO | WO 2016/204275 A1 | 12/2016 |

OTHER PUBLICATIONS

Office Action dated Feb. 8, 2022, in Japanese Patent Application No. 2019-537691 w/English translation.

* cited by examiner

Position in thickness direction in hole transport layer

Position in thickness direction in hole transport layer

ORGANIC PHOTOELECTRONIC ELEMENT COMPRISING FLUORINATED POLYMER

TECHNICAL FIELD

The present invention relates to an organic photoelectronic element.

BACKGROUND ART

Heretofore, as a self-emission type element, an organic photoelectronic element (organic electroluminescent element, hereinafter, organic EL element) is known. The organic EL element has, as the basic structure, a structure in which plural types of layers such as a light emitting layer, an electron transport layer, a hole transport layer, etc. are laminated between a pair of electrodes.

The organic EL element emits light, as photons are generated by recombination of electrons supplied from a power source and holes in the internal light emitting layer. In the field of organic EL elements, by the research and development over the years, the "internal quantum efficiency" being the percentage of "photons generated inside of the element" to "the number of injected electrons" has reached close to 100%.

On the other hand, even with organic EL elements in recent years, the "external quantum efficiency" being the percentage of "photons extracted to outside of the element" to "the number of injected electrons" remains to be only about from 20 to 30%, and an improvement is desired.

One of causes as to why the external quantum efficiency is low, is considered to be internal reflection due to a difference in refractive indexes of the respective layers constituting the organic EL element. As described above, the organic EL element has a plurality of layers in addition to the light emitting layer. These layers have refractive indexes different from one another. Therefore, light generated in the light emitting layer is considered to be reflected at the interfaces between the layers having different refractive indexes and damped or absorbed inside of the element before it is emitted to outside of the element.

Whereas an organic EL element is known in which, by incorporating nano-sized porous silica particles in the charge transport layer, the refractive index of the charge transport layer has been reduced (see Patent Document 1). By the organic EL element described in Patent Document 1, it is expected that reflection occurring at the interface between the charge transport layer and the layer in contact with the charge transport layer, is suppressed, whereby the external quantum efficiency will be improved.

PRIOR ART DOCUMENT

Patent Document

Patent Document 1: WO 2013/108618

DISCLOSURE OF INVENTION

Technical Problems

However, in view of a market demand requiring low power consumption and long service life of the element, the external quantum efficiency of the organic EL element is preferably as high as possible. In this regard, the external quantum efficiency of the organic EL element described in Patent Document 1 has room for improvement.

The present invention has been made in view of such circumstances, and has an object to provide an organic photoelectronic element, of which the external quantum efficiency is improved, the power consumption is low and the service life is prolonged.

Solution to Problems

To solve the above problems, one embodiment of the present invention provides an organic photoelectronic element comprising a substrate, an anode provided on the substrate, a cathode facing the anode, a light emitting layer disposed between the anode and the cathode, a hole transport layer provided in contact with the light emitting layer between the light emitting layer and the anode, wherein the hole transport layer contains an organic semiconductor material and a fluorinated polymer, and at the surface of the hole transport layer in contact with the light emitting layer, the fluorinated polymer is present.

In one embodiment of the present invention, the construction may be such that in the hole transport layer, the refractive index is continuously increasing towards the anode from the light emitting layer.

In one embodiment of the present invention, the construction may be such that the element further has a hole injection layer which is disposed between the hole transport layer and the anode and which contains a semiconductor material and a fluorinated polymer.

In one embodiment of the present invention, the construction may be such that the element further has a functional layer disposed between the cathode and the light emitting layer, wherein the functional layer has at least one of an electron transport layer and an electron injection layer, and contains a semiconductor material and a fluorinated polymer.

Advantageous Effects of Invention

According to the present invention, it is possible to provide an organic photoelectronic element, of which the external quantum efficiency is improved, the power consumption is low, and the service life is prolonged.

DESCRIPTION OF EMBODIMENTS

Figure 1:
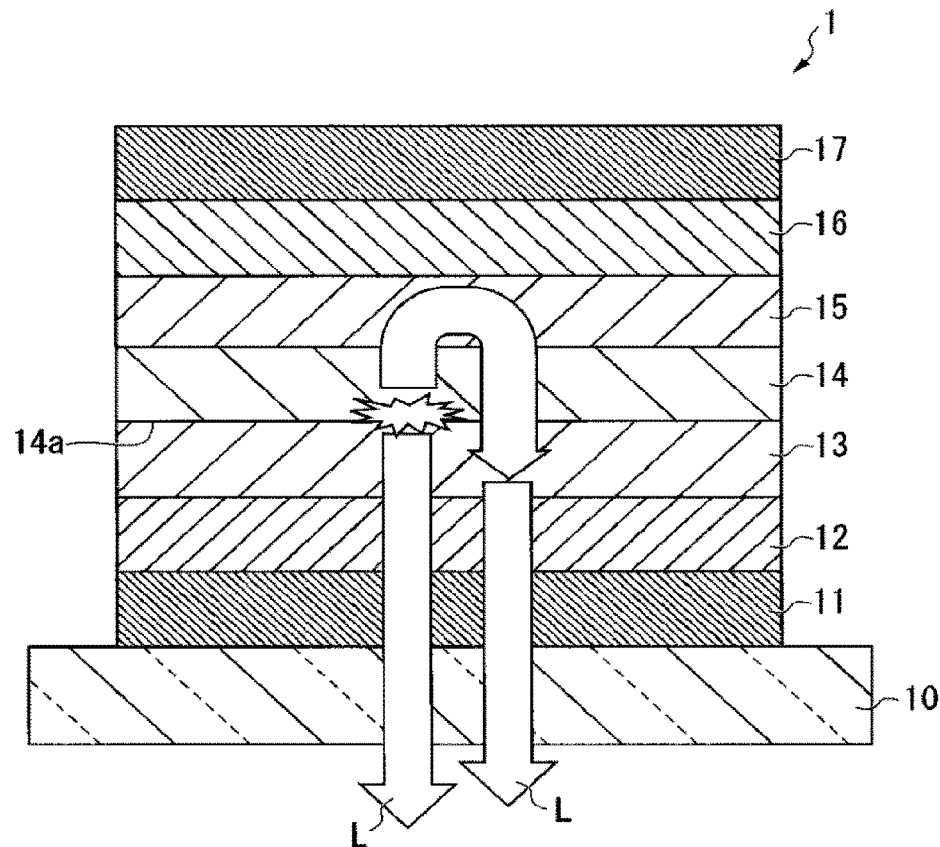
FIG. 1 is a schematic cross-sectional view showing an organic EL element 1 according to the first embodiment.

The "external quantum efficiency" is a value represented by the following formula.

$$\eta_{EQE} = \gamma \times \eta_s \times q \times \eta_{out}$$

$\eta_{EQE}$: external quantum efficiency (%), γ: charge balance, $\eta_s$: emitting exciton formation probability (%), q: emission quantum efficiency (%), $\eta_{out}$: light extraction efficiency (%).

The "weight average molecular weight" is a value which is measured by gel permeation chromatography (GPC). First, PMMA standard samples having known molecular weights are measured by GPC, and from the elution time and molecular weight of the peak top, a calibration curve is prepared. Then, a fluorinated polymer is measured, and from the calibration curve, the molecular weight is obtained, and the weight average molecular weight is obtained. As the mobile phase solvent, a solvent having 1,1,1,2,3,4,4,5,5,5-decafluoro-3-methoxy-2-(trifluoromethyl)pentane and hexafluoroisopropyl alcohol mixed in a volume ratio of 85:15, is used.

The "absorption coefficient (unit: $cm^{-1}$) of a layer containing a fluorinated polymer such as a hole transport layer" is a value measured by using an ultraviolet-visible spectrophotometer (manufactured by Shimadzu Corporation: UV-2450) with respect to the layer on a quartz substrate.

The "intrinsic viscosity [η] (unit: dl/g)" is a value measured by Ubbelohde viscometer (manufactured by Shibata Scientific Co., Ltd.: viscometer Ubbelohde) at a measurement temperature of 30° C. by using ASAHIKLIN (registered trademark) AC2000 (manufactured by Asahi Glass Company, Limited) as the solvent.

The "saturated vapor pressure (unit: Pa)" and "evaporation rate (unit: $g/m^2$ sec) are values measured by a vacuum differential thermal balance (manufactured by ADVANCE RIKO, Inc.: VPE-9000). 50 mg of a sample is charged in a cell having an inner diameter of 7 mm, and under a vacuum degree of $1 \times 10^{-3}$ Pa, the temperature is raised at a rate of 2° C. per minute, whereby the evaporation rate $g/m^2$ sec at 300° C. is measured. For the calculation of the saturated vapor pressure Pa, the evaporation rate and the weight-average molecular weight obtained by the above-mentioned GPC are used.

The "refractive index of a fluorinated polymer" is a value measured in accordance with JIS K 7142.

The "refractive index of a layer containing a fluorinated polymer, such as a hole transport layer" is a value measured by the following method.

By using a multi incident angle spectroscopic ellipsometry (manufactured by J.A. Woollam Co., Inc.: M-2000U), measurements are carried out by changing the incident angle of light to the layer on a silicon substrate, by 5 degrees every time in the range of from 45 to 75 degrees. At each angle, LP and A being ellipsometric parameters are measured at about 1.6 nm intervals in the wavelength range of from 450 to 800 nm. Using the above measurement data, the dielectric function of an organic semiconductor is subjected to fitting analysis by Cauchy model to obtain the refractive index of the layer to light of each wavelength.

First Embodiment

Hereinafter, with reference to FIG. 1, an organic photoelectronic element according to the first embodiment of the present invention will be described. In all of the following drawings, for the sake of clarity, the dimensions and ratios of the respective components are varied as appropriate.

FIG. 1 is a schematic cross-sectional view showing an organic photoelectronic element (organic EL element) 1 in this embodiment. The organic EL element 1 has a structure in which a substrate 10, an anode 11, a hole injection layer 12, a hole transport layer 13, a light emitting layer 14, an electron transport layer 15, an electron injection layer 16 and a cathode 17 are laminated in this order. The organic EL element 1 in this embodiment adopts a bottom emission system in which light L generated in the light emitting layer 14 will be emitted to the outside via the anode 11 and the substrate 10.

(Substrate)

The substrate 10 is provided with optical transparency. As the material for forming the substrate 10, it is possible to use an inorganic material such as glass, quartz glass or silicon nitride, or an organic polymer (resin) such as an acrylic resin or a polycarbonate resin. Further, it is also possible to use a composite material formed by laminating or mixing the above materials, so long as it has optical transparency.

Further, the substrate 10 is provided with various wirings and driving elements (not shown) which are electrically connected to the organic EL element.

(Anode)

The anode 11 is formed on the substrate 10, and supplies holes to the hole transport layer 13. Further, the anode 11 has optical transparency to transmit light emitted from the light emitting layer 14. As the material for forming the anode 11, it is possible to use an electrically conductive metal oxide such as ITO (Indium Tin Oxide: indium-doped tin oxide) or IZO (Indium Zinc Oxide: indium-doped zinc oxide). On the substrate 10 side of the anode 11, a translucent film may be provided.

The thickness of the anode 11 is not particularly limited, but is preferably from 30 to 300 nm. The thickness of the anode 11 is, for example, 100 nm.

(Hole Injection Layer)

The hole injection layer 12 is formed between the anode 11 and the hole transport layer 13. The hole injection layer 12 has a function to facilitate injection of holes from the anode 11 to the hole transport layer 13. Further, the hole injection layer 12 may not be formed.

The hole injection layer 12 may be formed by using a known semiconductor material. Such a material may, for example, be the following semiconductor materials.

A metal oxide such as molybdenum oxide or tungsten oxide;

an organometallic complex material such as copper phthalocyanine;

an arylamine material such as N,N'-di-(1-naphthyl)-N,N'-diphenyl benzidine (α-NPD), di-[4-(N, N-ditolyl-amino)-phenyl]cyclohexane (TAPC), $N^1,N^1,N^3,N^3$-tetra-m-tolyl-benzene-1,3-diamine (PDA), N,N'-diphenyl-N,N'-di(m-tolyl)benzidine (TPD), N,N'-diphenyl-N, N'-bis-[4-(phenyl-m-tolyl-amino)-phenyl]-biphenyl-4,4'-diamine (DNTPD), 4,4',4''-tris(3-methylphenyl phenylamino)triphenylamine (m-MTDATA), 4,4',4''-tris(N,N-diphenylamino)triphenylamine (TDATA), dipyrazino[2,3-f:2',3'-h]quinoxaline-2,3,6,7,10,11-hexacarbonitrile (HAT-CN), 9, 9',9''-triphenyl-9H,9'H,9''H-3,3':6',3''-tercarbazole (Tris-PCz), or 4,4',4''-tris(N, N-2-naphthylphenylamino)triphenylamine (2-TNATA);

a polymer semiconductor material such as polyaniline/dodecylbenzenesulfonic acid (PANI/DBSA), poly(3,4-ethylenedioxythiophene)/poly(4-styrene sulfonate) (PEDOT/PSS), polyaniline/camphorsulfonic acid (PANI/CSA), or polyaniline/poly(4-styrenesulfonate) (PANI/PSS);

a commercial product such as; N-(diphenyl-4-yl)-9,9-dimethyl-N-(4-(9-phenyl-9H-carbazoyl-3-yl)phenyl)-9H-fluorene-2-amine (hereinafter referred to as "HT211"), HTM081 (manufactured by Merck), HTM163 (manufactured by Merck), HTM222 (manufactured by Merck), NHT-5 (manufactured by Novaled), NHT-18 (manufactured by Novaled), NHT-49 (manufactured by Novaled), NHT-51 (manufactured by Novaled), NDP-2 (manufactured by Novaled), or NDP-9 (manufactured by Novaled).

As such a material for forming the hole injection layer 12, a commercially available product may be used, or a synthesized product may be used. Further, as the material for forming the hole injection layer 12, one type may be used alone, or two or more types may be used in combination.

Further, the material for forming the hole injection layer 12 may contain a dopant to facilitate the transfer of charges to and from the fluorinated polymer and the organic semiconductor material as described below. Specific examples of the dopant for the hole injection material may be an organic dopant such as TCNQ, $F_4$-TCNQ, PPDN, TCNNQ, $F_6$-TCNNQ, HAT-CN, HATNA, HATNA-Cl6, HATNA-F6, $C_{60}F_{36}$, $F_{16}$-CuPc, NDP-2 (manufactured by Novaled), or NDP-9 ((manufactured by Novaled), and an inorganic dopant such as $MoO_3$, $V_2O_5$, $WO_3$, $ReO_3$, or CuI. As the organic semiconductor material, one type may be used alone, or two or more types may be used in combination. Also as the fluorinated polymer, one type may be used alone, or two or more types may be used in combination.

The thickness of the hole injection layer 12 is not particularly limited, but is preferably from 1 to 300 nm. The thickness of the hole injection layer 12 is, for example, 5 nm.

(Hole Transport Layer)

The hole transport layer 13 is formed on the hole injection layer 12. In a case where there is no hole injection layer 12, the hole transport layer 13 will be formed on the anode 11. The hole transport layer 13 has a function to satisfactorily transport holes injected from the anode 11 towards the light emitting layer 14. The hole transport layer 13 may be a single layer or may be a laminate of a plurality of layers.

The hole transport layer 13 contains an organic semiconductor material and a fluorinated polymer. On the surface of the hole transport layer 13 in contact with the light emitting layer 14, the fluorinated polymer is present.

Therefore, the hole transport layer 13 is made to have a lower refractive index than a hole transport layer composed of only an organic semiconductor material. The hole transport layer 13 preferably has a lower refractive index than the light emitting layer 14 in the wavelength range of from 450 to 800 nm, and the refractive index of the hole transport layer 13 is preferably at most 1.60, more preferably at most 1.55, further preferably at most 1.50. The refractive index of the light emitting layer 14 can be adjusted by controlling the mixing ratio of the organic semiconductor material and the fluorinated polymer in the hole transport layer 13. As the hole transport layer 13 has a low refractive index, the light extraction efficiency generated internally of the organic EL element 1 will be improved.

(Organic Semiconductor Material)

As the organic semiconductor material being a material for forming the hole transport layer 13, it is possible to employ a compound known as a hole transporting material to receive and transport holes injected from the anode.

As the hole transporting material, an aromatic amine derivative may be preferably exemplified. As specific examples, the following α-NPD, TAPC, PDA, TPD, m-MTDATA, etc. may be mentioned.

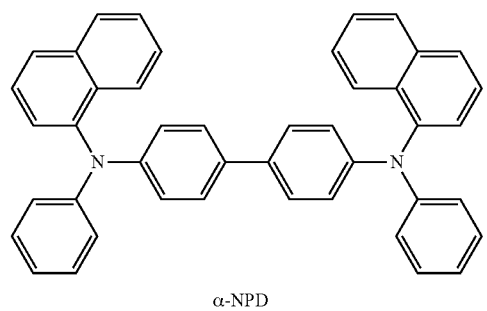

α-NPD

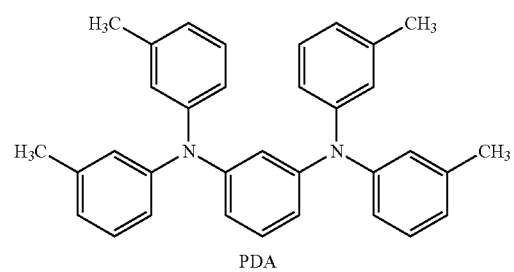

PDA

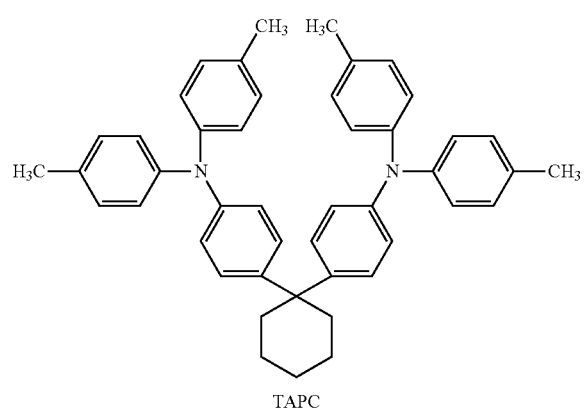

TAPC

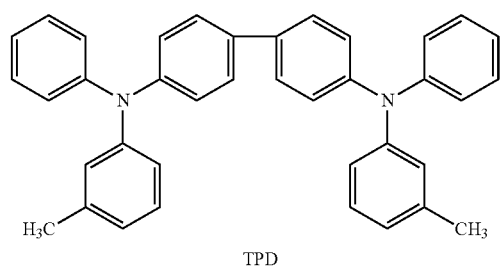

TPD

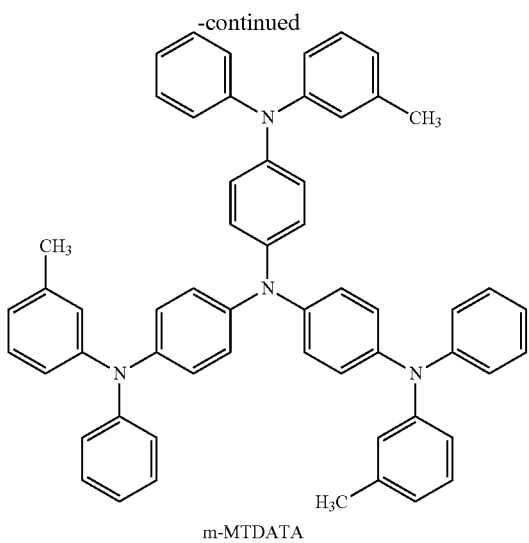

m-MTDATA

Other hole transporting materials may be arylamine materials such as N,N'-diphenyl-N, N'-bis-[4-(phenyl-m-tolylamino)-phenyl]-biphenyl-4,4'-diam ine (DNTPD), N,N'-di (1-naphthyl)-N,N'-diphenyl benzidine (NPB), 4,4',4"-tris(N, N-diphenylamino)triphenylamine (TDATA), dipiperadino [2,3-f:2',3'-h]quinoxaline-2,3,6,7,10,11-hexacarbonitrile (HAT-CN), 9,9',9"-triphenyl-9H,9'H,9"H-3,3':6',3"-tercarbazole (Tris-PCz), 4,4',4"-tris(N, N-2-naphthylphenylamino)triphenylamine (2-TNATA), 4,4',4"-tri(9-carbazoyl)triphenylamine (TCTA), 2,2',7,7'-tetrakis(N,N-diphenylamino)-2,7-diamino-9,9'-spirobifluorene (Spiro-TAD), 2,2',7,7'-tetrakis(N,N-di-p-methoxyphenylamino)-9, 9'-spirobifluorene (Spiro-MeOTAD), etc.; polymer semiconductor materials such as polyaniline/dodecylbenzenesulfonic acid (PANI/DBSA), poly(3,4-ethylenedioxythiophene)/poly(4-styrene sulfonate) (PEDOT/PSS), polyaniline/camphorsulfonic acid (PANI/CSA), polyaniline/poly(4-styrenesulfonate) (PANI/PSS), etc.; commercial products such as N-(diphenyl-4-yl)-9,9-dim ethyl-N-(4-(9-phenyl-9H-carbazoyl-3-yl) phenyl)-9H-fluorene-2-amine (hereinafter referred to as "HT211"), HTM081 (manufactured by Merck), HTM163 (manufactured by Merck), HTM222 (manufactured by Merck), NHT-5 (manufactured by Novaled) NHT-18 (manufactured by Novaled), NHT-49 (manufactured by Novaled), NHT-51 (manufactured by Novaled), NDP-2 (manufactured by Novaled), NDP-9 (manufactured by Novaled), etc.

As such a material for forming the hole transport layer 13, a commercial product may be used, or a synthetic product may be used. Further, as the material for forming the hole transport layer 13, one type may be used alone, or two or more types may be used in combination.

(Fluorinated Polymer)

The fluorinated polymer contained in the charge injection layer and the charge transport layer of the present invention is a polymer containing fluorine atoms. In this embodiment, an oligomer will also be included in the polymer. That is, the fluorinated polymer may be an oligomer.

The fluorinated polymer preferably has a sufficient evaporation rate or saturated vapor pressure for practical use at a temperature below a level where the thermal decomposition of the fluorinated polymer takes place, from the viewpoint of the rate of formation of a layer such as a hole transport layer, and the strength and surface roughness of the layer. The thermal decomposition initiation temperature of PTFE being a common fluorinated polymer is about 400° C., and the thermal decomposition initiation temperature of Teflon (registered trademark) AF is 350° C. The evaporation rate at 300° C. of the fluorinated polymer according to this embodiment is preferably at least 0.01 g/m² sec., more preferably at least 0.02 g/m² sec. Further, the saturation vapor pressure at 300° C. is preferably at least 0.001 Pa, more preferably at least 0.002 Pa. From this viewpoint, the fluorinated polymer is preferably a perfluoropolymer, of which the intermolecular interaction is considered to be small. Further, a polymer having an aliphatic ring structure in its main chain, of which crystallinity is said to be low, is more preferred. Here, having an aliphatic ring structure in its main chain, means that the fluorinated polymer has an aliphatic ring structure (ring structure which does not exhibit aromaticity) in repeating units, and at least one of carbon atoms constituting the aliphatic ring constitutes the main chain.

In this specification, the saturated vapor pressure (unit: Pa) is a value measured by a vacuum differential thermal balance (manufactured by ADVANCE RIKO, Inc.: VPE-9000).

The weight average molecular weight (hereinafter represented by "Mw") of the fluorinated polymer is preferably from 1,500 to 50,000, more preferably from 3,000 to 40,000, further preferably from 5,000 to 30,000. When the weight average molecular weight is at least 1,500, sufficient strength is likely to be readily obtainable in the case of forming a layer by the fluorinated polymer. On the other hand, when the weight average molecular weight is at most 50,000, the fluorinated polymer has a saturated vapor pressure which presents a practical layer forming rate (deposition rate), whereby it will be unnecessary to heat the deposition source to a high temperature, specifically to a temperature exceeding 400° C. If the temperature of the deposition source is too high, the main chain of the fluorinated polymer is likely to be cleaved in the vapor deposition process, whereby the fluorinated polymer ends up to have a low molecular weight, and the strength of the layer to be formed tends to be insufficient, and further, defects derived from decomposed products will be formed, whereby it will be difficult to obtain a smooth surface. Moreover, such a possibility is assumed that molecules or ions formed by cleavage of the main chain and unintentionally included, may affect the electrical conductivity of the film or the light emission lifetime of the organic EL element.

Therefore, when Mw is within the range of from 1,500 to 50,000, it is possible to form a layer having a sufficient strength and smooth surface without causing cleavage of the main chain of the fluorinated polymer.

The "polydispersity" is meant for the proportion of Mw to the number average molecular weight (hereinafter represented by "Mn"), i.e. Mw/Mn. From the viewpoint of the stability of quality in the layer to be formed, the polydispersity (molecular weight distribution) (Mw/Mn) of the fluorinated polymer should better be small, preferably at most 2. Here, the theoretical lower limit of the polydispersity is 1. As a method for obtaining a fluorinated polymer having a small polydispersity, a method of carrying out controlled polymerization such as living radical polymerization, a molecular weight fractionation purification method using size exclusion chromatography, or a molecular weight fractionation purification method by sublimation purification, may be mentioned. Among these methods, in consideration of the stability of the deposition rate when applying a vapor deposition method for formation of the layer, it is preferred to carry out the sublimation purification.

In this specification, Mw and Mn are values measured by gel permeation chromatography (GPC).

The glass transition temperature (Tg) of the fluorinated polymer should better be high, since the reliability of the obtainable element becomes high. Specifically the glass transition temperature is preferably at least 60° C., more preferably at least 80° C., particularly preferably at least 100° C. The upper limit is not particularly limited, but is preferably 350° C., more preferably 300° C.

In a case where the perfluoropolymer having a fluorinated aliphatic ring structure in its main chain, is a perfluoropolymer (referred to also as a polyperfluoro(3-butenyl vinyl ether) consisting solely of repeating units formed by cyclopolymerization of perfluoro(3-butenyl vinyl ether), the intrinsic viscosity [η] is preferably from 0.01 to 0.14 dl/g, more preferably from 0.02 to 0.1 dl/g, particularly preferably from 0.02 to 0.08 dl/g. When [η] is at least 0.01 dl/g, the molecular weight of the fluorinated polymer becomes to be relatively large, whereby it tends to be easy to obtain sufficient strength in the layer after formation. On the other hand, when [η] is at most 0.14 dl/g, the molecular weight of the fluorinated polymer becomes to be relatively small, whereby it will have a saturated vapor pressure which gives a practical deposition rate.

In this specification, the intrinsic viscosity [η] (unit: dl/g) is a value measured by the Ubbelohde viscometer (manufactured by Shibata Scientific Co., Ltd.: viscometer Ubbelohde) at a measurement temperature of 30° C. by using ASAHIKLIN (registered trademark) AC2000 (manufactured by Asahi Glass Company, Limited) as the solvent.

The upper limit value of the refractive index at a wavelength of from 450 nm to 800 nm of the fluorinated polymer is preferably 1.5, more preferably 1.4. When the refractive index is at most 1.5, it is possible to lower the refractive index of a layer such as a charge injection layer or charge transport layer obtainable by mixing with an organic semiconductor material, to a level of 1.55, i.e. equivalent to the refractive index of e.g. a glass substrate, such being preferred since the light extraction efficiency will be improved. On the other hand, the theoretical lower limit value for the refractive index is 1.0.

The refractive index of the organic semiconductor material is generally at a level of from 1.7 to 1.8. To such a common organic semiconductor material, by mixing a fluorinated polymer having a refractive index of at most 1.5, it is possible to reduce the refractive index of the obtainable charge injection layer, charge transport layer or the like. When the refractive index of the charge injection layer or charge transport layer is lowered to be close to the refractive index of an electrode, glass substrate or the like (the refractive indexes of soda glass and quartz glass are, respectively, from about 1.51 to 1.53, and from about 1.46 to 1.47, in the visible light region) adjacent to the charge injection layer or charge transport layer, it is possible to avoid the total reflection occurring at the interface between the charge injection layer or charge transport layer, and the electrode or glass substrate, whereby light extraction efficiency will be improved.

As the fluorinated polymer, the following polymers (1) and (2) may be mentioned. Polymer (1): A fluorinated polymer having no aliphatic ring and having units (hereinafter referred to also as "fluoroolefin units") derived from a fluoroolefin, in the main chain.

Polymer (2): A fluorinated polymer having an aliphatic ring in the main chain.

«Polymer (1)»

The polymer (1) may be a homopolymer of a fluoroolefin, or a copolymer of a fluoroolefin and another monomer copolymerizable with the fluoroolefin.

The fluoroolefin may be tetrafluoroethylene, hexafluoropropylene, chlorotrifluoroethylene, vinylidene fluoride, vinyl fluoride, a perfluoroalkyl ethylene (such as one having a $C_{1-10}$ perfluoroalkyl group), a perfluoro(alkyl vinyl ether), trifluoroethylene, etc.

Among the exemplified ones, from such a viewpoint that it is easy to lower the refractive index of the charge injection layer and the charge transport layer, tetrafluoroethylene, hexafluoropropylene or a perfluoro(alkyl vinyl ether) where all of hydrogen atoms bonded to carbon atoms are substituted by fluorine, is preferred.

As another monomer copolymerizable with the fluoroolefin, a vinyl ether, a vinyl ester, an aromatic vinyl compound, an allyl compound, an acryloyl compound, a methacryloyl compound, or the like, may be mentioned.

In a case where the polymer (1) is a copolymer, the proportion of units derived from a fluoroolefin is preferably at least 20 mol %, more preferably at least 40 mol %, further preferably at least 80 mol %.

A functional group at a terminal of the main chain of the polymer (1) is preferably a less reactive functional group. The less reactive functional group may, for example, be an alkoxycarbonyl group, a trifluoromethyl group or the like.

As the polymer (1), a synthesized one may be used, or a commercially available product may be used.

The polymer (1) includes the following fluorinated polymers.

Polytetrafluoroethylene (PTFE), a tetrafluoroethylene-perfluoro(alkyl vinyl ether) copolymer (manufactured by Asahi Glass Company, Limited: Fluon (registered trademark) PFA), a tetrafluoroethylene/hexafluoropropylene copolymer (FEP), a tetrafluoroethylene/perfluoro(alkyl vinyl ether)/hexafluoropropylene copolymer (EPA), an ethylene-tetrafluoroethylene copolymer (manufactured by Asahi Glass Co. Ltd.: Fluon (registered trademark) ETFE), polyvinylidene fluoride (PVdF), polyvinyl fluoride (PVF), polychlorotrifluoroethylene (PCTFE), an ethylene/chlorotrifluoroethylene copolymer (ECTFE), etc.

Among the exemplified ones, from such a viewpoint that it is easy to lower the refractive indexes of the charge injection layer and the charge transport layer, polytetrafluoroethylene (PTFE), a tetrafluoroethylene/perfluoro(alkyl vinyl ether) copolymer (PFA), a tetrafluoroethylene/hexafluoropropylene copolymer (FEP), and a tetrafluoroethylene/perfluoro(alkyl vinyl ether)-hexafluoropropylene copolymer (EPA) where all hydrogen atoms or chlorine atoms bonded to carbon atoms are substituted by fluorine, are preferred.

The polymer (1) can be produced by using a known method.

As the polymer (1), a synthesized one may be used, or a commercially available product may be used.

«Polymer (2)»

The polymer (2) is a fluorinated polymer having an aliphatic ring in the main chain. The "fluorinated polymer having an aliphatic ring structure in the main chain" means that the fluorinated polymer has units having an aliphatic ring structure, and at least one of carbon atoms constituting the aliphatic ring is the carbon atom constituting the main chain. The aliphatic ring may be a ring having a hetero atom such as an oxygen atom.

The "main chain" of a polymer is meant for a chain of carbon atoms derived from two carbon atoms constituting a polymerizable double bond in a polymer of a monoene having a polymerizable double bond, or a chain of carbon atoms derived from four carbon atoms constituting two polymerizable double bonds in a cyclized polymer of a cyclopolymerizable diene. In a copolymer of a monoene and a cyclopolymerizable diene, the main chain is composed of the above two carbon atoms of the monoene and the above four carbon atoms of the diene.

Therefore, in the case of a polymer of a monoene having an aliphatic ring, it is a polymer of a monoene having such a structure that one carbon atom constituting the ring skeleton of the aliphatic ring, or adjacent two carbon atoms constituting the ring skeleton, are carbon atoms to constitute a polymerizable double bond. In the case of a cyclized polymer of a cyclopolymerizable diene, as described below, from 2 to 4 among four carbon atoms constituting the two double bonds, become carbon atoms constituting the aliphatic ring.

The number of atoms constituting the ring skeleton of the aliphatic ring in the polymer (2) is preferably from 4 to 7, particularly preferably from 5 to 6. That is, the aliphatic ring is preferably a 4 to 7-membered ring, particularly preferably a 5 to 6-membered ring. In a case where a hetero atom is present as an atom constituting the ring of an aliphatic ring, as such a hetero atom, an oxygen atom, a nitrogen atom or the like may be mentioned, and an oxygen atom is preferred. Further, the number of hetero atoms constituting the ring is preferably from 1 to 3, more preferably 1 or 2.

The aliphatic ring may have a substituent or may not have a substituent. "May have a substituent" means that a substituent may be bonded to an atom constituting the ring skeleton of the aliphatic ring.

Hydrogen atoms bonded to carbon atoms constituting the aliphatic ring of the polymer (2) are preferably substituted by fluorine atoms. Further, also in a case where the aliphatic ring has a substituent and has hydrogen atoms bonded to carbon atoms in the substituent, such hydrogen atoms are preferably substituted by fluorine atoms. As a substituent having fluorine atoms, a perfluoroalkyl group, a perfluoroalkoxy group, =CF$_2$, etc. may be mentioned.

As the aliphatic ring in the polymer (2), from such a viewpoint that it is easy to lower the refractive index of the charge injection layer and the charge transport layer, a perfluoroaliphatic ring (an aliphatic ring in which all of hydrogen atoms bonded to carbon atoms, including a substituent, are substituted by fluorine atoms) is preferred.

The polymer (2) includes the following polymers (21) and (22).

Polymer (21): A fluorinated polymer having units derived from a fluorinated cyclic monoene.

Polymer (22): A fluorinated polymer having units formed by cyclopolymerization of a cyclopolymerizable fluorinated diene (hereinafter simply referred to also as a "fluorinated diene").

Fluoropolymer (21):

The "fluorinated cyclic monoene" is a fluorinated monomer having one polymerizable double bond between carbon atoms constituting an aliphatic ring, or a fluorinated monomer having one polymerizable double bond between a carbon atom constituting an aliphatic ring and a carbon atom outside of the aliphatic ring.

As the fluorinated cyclic monoene, the following compound (1) or compound (2) is preferred.

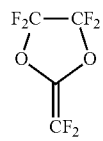

(2-1)

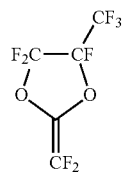

(2-2)

[wherein $X^1$, $X^2$, $X^3$, $X^4$, $Y^1$ and $Y^2$ are each independently a fluorine atom, a perfluoroalkyl group which may contain an etheric oxygen atom (—O—), or a perfluoroalkoxy group which may contain an etheric oxygen atom; and $X^3$ and $X^4$ may be bonded to each other to form a ring.]

In a perfluoroalkyl group for $X^1$, $X^2$, $X^3$, $X^4$, $Y^1$ and $Y^2$, the number of carbon atoms is preferably from 1 to 7, particularly preferably from 1 to 4. The perfluoroalkyl group is preferably a linear or branched chain, and a linear chain is particularly preferred. Specifically, a trifluoromethyl group, a pentafluoroethyl group, a heptafluoropropyl group, etc. may be mentioned, and a trifluoromethyl group is particularly preferred.

As the perfluoroalkoxy group for $X^1$, $X^2$, $X^3$, $X^4$, $Y^1$ and $Y^2$, one having an oxygen atom (—O—) added to the above perfluoroalkyl group may be mentioned, and a trifluoromethoxy group is particularly preferred.

In the formula (1), $X^1$ is preferably a fluorine atom.

$X^2$ is preferably a fluorine atom, a trifluoromethyl group or a $C_{1-4}$ perfluoroalkoxy group, particularly preferably a fluorine atom or a trifluoromethoxy group.

$X^3$ and $X^4$ are each independently preferably a fluorine atom or a $C_{1-4}$ perfluoroalkyl group, particularly preferably a fluorine atom or a trifluoromethyl group.

$X^3$ and $X^4$ may be bonded to each other to form a ring. The number of atoms constituting the ring skeleton of the ring is preferably from 4 to 7, particularly preferably from 5 to 6.

As preferred examples of the compound (1), compounds (1-1) to (1-5) may be mentioned.

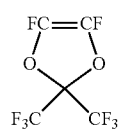

(1-1)

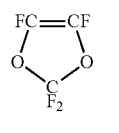

(1-2)

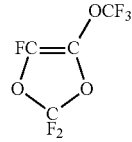

(1-3)

-continued

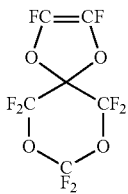
(1-4)

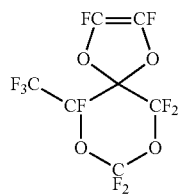
(1-5)

In the formula (2), $Y^1$ and $Y^2$ are each independently preferably a fluorine atom, a $C_{1-4}$ perfluoroalkyl group or a $C_{1-4}$ perfluoroalkoxy group, particularly preferably a fluorine atom or a trifluoromethyl group.

As preferred examples of the compound (2), compounds (2-1) and (2-2) may be mentioned.

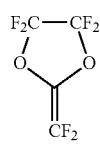
(2-1)

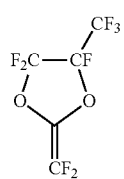
(2-2)

The polymer (21) may be a homopolymer of the above fluorinated cyclic monoene, or a copolymer of the fluorinated cyclic monoene and another copolymerizable monomer.

However, the proportion of units derived from the fluorinated cyclic monoene to all units in the polymer (21) is preferably at least 20 mol %, more preferably at least 40 mol %, further preferably 100 mol %.

As another monomer copolymerizable with the fluorinated cyclic monoene, for example, a fluorinated diene, a monomer having a reactive functional group in the side chain, tetrafluoroethylene, chlorotrifluoroethylene, perfluoro(methyl vinyl ether), etc. may be mentioned.

The fluorinated diene may be the same one as mentioned below in the description of the polymer (22). The monomer having a reactive functional group in the side chain may be a monomer having a polymerizable double bond and a reactive functional group. The polymerizable double bond may be $CF_2=CF-$, $CF_2=CH-$, $CH_2=CF-$, $CFH=CF-$, $CFH=CH-$, $CF_2=C-$, $CF=CF-$, etc. The reactive functional group may be the same one as mentioned below in the description of the polymer (22).

A polymer obtainable by copolymerization of a fluorinated cyclic monoene and a fluorinated diene is a polymer (21).

Polymer (22):

The "fluorinated diene" is a cyclopolymerizable fluorinated monomer having two polymerizable double bonds and fluorine atoms. The polymerizable double bond is preferably a vinyl group, an allyl group, an acryloyl group, or a methacryloyl group. The fluorinated diene is preferably the following compound (3).

$$CF_2=CF-Q-CF=CF_2 \quad (3).$$

In the formula (3), Q is a $C_{1-5}$, preferably $C_{1-3}$, perfluoroalkylene group which may have a branch and which may contain an etheric oxygen atom, wherein some of fluorine atoms may be substituted by halogen atoms other than fluorine atoms. The halogen atoms other than fluorine atoms may be chlorine atoms, bromine atoms, etc.

Q is preferably a perfluoroalkylene group containing an etheric oxygen atom. In that case, the etheric oxygen atom in the perfluoroalkylene group may be present at one terminal of the perfluoroalkylene group, may be present at both terminals of the perfluoroalkylene group, or may be present between carbon atoms in the perfluoroalkylene group. From the viewpoint of cyclopolymerization, it is preferred that the etheric oxygen atom is present at one terminal of the perfluoroalkylene group.

Specific examples of the compound (3) include the following compounds.

$CF_2=CFOCF_2CF=CF_2$,
$CF_2=CFOCF(CF_3)CF=CF_2$,
$CF_2=CFOCF_2CF_2CF=CF_2$,
$CF_2=CFOCF_2CF(CF_3)CF=CF_2$,
$CF_2=CFOCF(CF_3)CF_2CF=CF_2$,
$CF_2=CFOCFClCF_2CF=CF_2$,
$CF_2=CFOCCl_2CF_2CF=CF_2$,
$CF_2=CFOCF_2OCF=CF_2$,
$CF_2=CFOC(CF_3)_2OCF=CF_2$,
$CF_2=CFOCF_2CF(OCF_3)CF=CF_2$,
$CF_2=CFCF_2CF=CF_2$,
$CF_2=CFCF_2CF_2CF=CF_2$,
$CF_2=CFCF_2OCF_2CF=CF_2$.

Units to be formed by cyclopolymerization of the compound (3) include the following units (3-1) to (3-4).

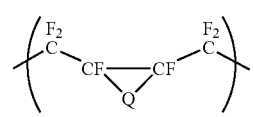
(3-1)

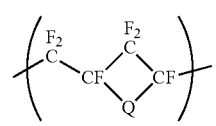
(3-2)

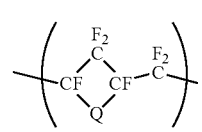
(3-3)

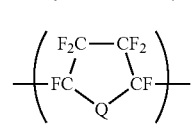
(3-4)

The polymer (22) may be a homopolymer of a fluorinated diene, or a copolymer of a fluorinated diene and another copolymerizable monomer.

As another monomer copolymerizable with the fluorinated diene, for example, a monomer having a reactive functional group in the side chain, tetrafluoroethylene, chlorotrifluoroethylene, perfluoro(methyl vinyl ether), etc. may be mentioned.

A specific example of the polymer (22) may, for example, be a polymer represented by the following formula (3-1-1) obtainable by cyclopolymerizing $CF_2=CFOCF_2CF_2CF=CF_2$ (perfluoro(3-butenyl vinyl ether)).

In the following, the perfluoro(3-butenyl vinyl ether) will be referred to as "BVE".

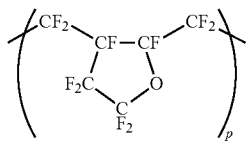

(3-1-1)

Here, in the formula (3-1-1), p is an integer of from 5 to 1,000.

p is preferably an integer of from 10 to 800, particularly preferably an integer of from 10 to 500.

The functional group at a terminal of the main chain of the polymer (2) is preferably a less reactive functional group. The less reactive functional group may, for example, be an alkoxycarbonyl group or a trifluoromethyl group.

As the polymer (2), a synthesized one may be used, or a commercially available product may be used.

As specific examples of the polymer (2), a BVE cyclized polymer (manufactured by Asahi Glass Company, Limited: CYTOP (registered trademark)), a tetrafluoroethylene/perfluoro(4-methoxy-1,3-dioxole) copolymer (manufactured by Solvay: Hyflon (registered trademark) AD), a tetrafluoroethylene/perfluoro(2,2-dimethyl-1,3-dioxole) copolymer (manufactured by Dupont: Teflon (registered trademark) AF), and a perfluoro(4-methyl-2-methylene-1,3-dioxolane) polymer (MMD polymer) are preferred.

In the present invention, the fluorinated polymer is preferably the polymer (2), more preferably the polymer (22), particularly preferably a fluorinated polymer represented by the formula (3-1-1) obtainable by cyclopolymerizing BVE.

The material for forming the hole transport layer 13 may contain a dopant to facilitate the transfer of charge to and from the above described fluorinated polymer and organic semiconductor material. As specific examples of the dopant for forming the hole transport material, organic dopants such as TCNQ, $F_4$-TCNQ, PPDN, TCNNQ, $F_6$-TCNNQ, HAT-CN, HATNA, HATNA-C16, HATNA-F6, $C_{60}F_{36}$, $F_{16}$-CuPc, NDP-2 (manufactured by Novaled), NDP-9 (manufactured by Novaled), etc., or inorganic dopants such as $MoO_3$, $V_2O_5$, $WO_3$, $ReO_3$, CuI, etc. may be mentioned. Here, as the organic semiconductor material, one type may be used alone, or two or more types may be used in combination. Also as the fluorinated polymer, one type may be used alone, or two or more types may be used in combination.

In the material for forming the hole transport layer 13, the volume ratio of the fluorinated polymer to the organic semiconductor material is preferably from 70:30 to 5:95, more preferably from 60:40 to 20:80. When the volume ratio of the fluorinated polymer to the organic semiconductor material is within the above range, the refractive index of the hole transport layer 13 to be obtained will be lowered to a level equal to the refractive index of a glass substrate or the like, whereby the light extraction efficiency of the organic EL element will be improved, such being preferred.

Such a hole transport layer 13 may be formed by a known dry coating method or wet coating method.

In a case where the organic semiconductor material to be used is a polymeric material, for the formation of the hole transport layer 13, it is preferred to adopt a known wet coating method. As the wet coating method, an inkjet method, a cast coating method, a dip coating method, a bar coating method, a blade coating method, a roll coating method, a gravure coating method, a flexo coating method, a spray coating method, etc. may be mentioned. In the case of adopting a wet coating method, a solution or dispersion in which the organic semiconductor material and the fluorinated polymer to be used, are mixed in a desired ratio, may be prepared and film-deposited by any one of the above-mentioned methods.

In a case where the organic semiconductor material to be used is a low molecular material, for the formation of the hole transport layer 13, it is preferred to adopt a known dry coating method. The dry coating is preferred because it is thereby easy to film-deposit the fluorinated polymer and the organic semiconductor material in a uniform mixing ratio.

As the dry coating method, a physical vapor deposition method such as a resistance heating vapor deposition method, an electron beam vapor deposition method or a sputtering method, may be mentioned. A hole transport layer 13 to be formed by a physical vapor deposition method is a physical vapor deposition layer. In a case where the material for forming the hole transport layer 13 is a low molecular material, a probability such that the hole transport layer 13 will be a physical vapor deposition layer, is high. Among them, since film-formation will be easy without decomposing the organic semiconductor and the fluorinated polymer, a resistance heating vapor deposition method is preferred, and particularly preferred is a co-vapor deposition method by resistance heating, which comprises a step of co-vapor depositing a fluorinated polymer and an organic semiconductor material.

The vapor deposition rate in co-vapor deposition (the vapor deposition rate of the total of the fluorinated polymer and the organic semiconductor material) is not particularly limited, but it is preferably from 0.001 to 10 nm/s. At that time, the mixing ratio can be controlled by the vapor deposition speed ratio of the fluorinated polymer and the organic semiconductor material.

Of the hole transport layer 13, the absorption coefficient in the wavelength range of from 450 nm to 800 nm is preferably at most 5,000 $cm^{-1}$, more preferably at most 1,000 $cm^{-1}$, and it is particularly preferred that it has no absorption band in the above wavelength region.

If the absorption coefficient of each layer constituting the hole transport layer 13 exceeds 5,000 $cm^{-1}$, when light passes once through the hole transport layer having a thickness of 100 nm, 5% of the light will be absorbed when the total amount of the light before passing is assumed to be 100%. Inside of the organic EL element, by multiple interference of light, losses due to absorption of light at the time of passing through the hole transport layer 13 will accumulate. Therefore, the light absorption at the time of passing through the hole transport layer becomes a factor which significantly lowers the light extraction efficiency. It is extremely important to use a hole transport layer having a sufficiently small light absorption in order not to impair the light emission efficiency of the organic electroluminescence element. When the light emission efficiency of the organic EL element is not impaired, energy utilization efficiency becomes high, and the element lifetime becomes longer as a result of suppression of heat generation due to light absorption.

The thickness of the hole transport layer 13 is not particularly limited, but it is preferably from 10 nm to 350 nm, more preferably from 20 nm to 300 nm.

(Light Emitting Layer)

The light emitting layer 14 is formed in contact with the hole transport layer 13. In the light emitting layer 14, holes injected from the anode 11 and electrons injected from the cathode 17 are recombined to emit light by emitting photons. The emission wavelength at that time is determined depending on the material for forming the light emitting layer 14.

As the material for forming the light emitting layer 14, a known one may be employed such as a fluorescent material, a heat activated delayed fluorescence (TADF) material or a phosphorescent material. For example, as the material for forming the light emitting layer 14, a light emitting dopant material such as (E)-2-(2-(4-(dimethylamino)styryl)-6-methyl-4H-pyran-4-ylidene)malononitrile (DCM), 4-(dicyanomethylene)-2-methyl-6-julolidyl-9-enyl-4H-pyran (DCM$_2$), Rubrene, Coumarin 6, Ir(ppy)$_3$, (ppy)$_2$Ir(acac), etc., a phosphorescent host material, such as 4,4'-bis(9H-carbazol-9-yl)biphenyl (CBP), 3,3'-di(9H-carbazol-9-yl)-1,1'-biphenyl (mCBP), etc., a fluorescent host material such as ADN, Alq$_3$, etc., a polymer material such as polyphenylene vinylene (PPV), MEH-PPV, etc., may be mentioned, but the material is not limited thereto. As the material for forming the light emitting layer 14, one type may be used alone, or two or more types may be used in combination, and it is suitably selected depending on the desired light emission wavelength. The refractive index of the light emitting layer 14 is from 1.65 to 1.90 in the wavelength range of 450 nm to 800 nm, and, for example, it is from 1.70 to 1.80 at a wavelength of 600 nm.

The thickness of the light emitting layer 14 is not particularly limited, but is preferably from 10 to 30 nm. The thickness of the light emitting layer 14 is, for example, 15 nm.

(Electron Transport Layer)

The electron transport layer 15 is formed in contact with the light emitting layer 14. The electron transport layer 15 has a function to satisfactorily transport electrons injected from the cathode 17 towards the light emitting layer 14. The electron transport layer 15 may not be formed.

As the material for forming the electron transport layer 15, it is possible to adopt a known one. For example, as the material for forming the electron transport layer 15, the following Alq$_3$, PBD, TAZ, BND, OXD-7, or 2,2',2''-(1,3,5 benzenetriyl)-tris(1-phenyl-1-H-benzimidazole) (TPBi) may be mentioned. As other examples, as the material for forming the electron transport layer 15, 2,9-dimethyl-4,7-diphenyl-1,10-phenanthroline (BCP), t-Bu-PBD, and silole derivatives may also be mentioned. The material for forming the electron transport layer 15 is not limited thereto. The electron transport layer 15 may contain a material common to the light emitting layer 14.

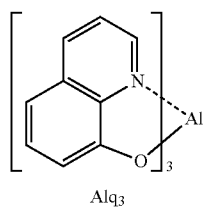

Alq$_3$

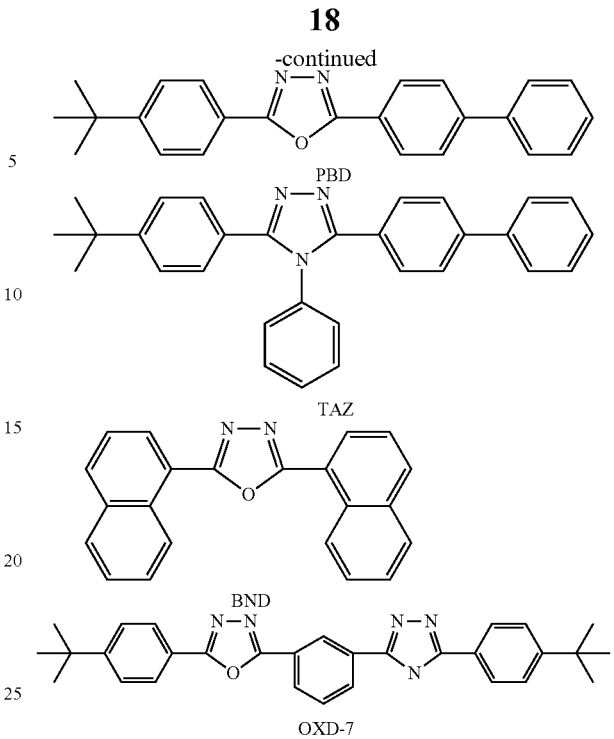

Further, the electron transport layer 15 may contain the after-described fluorinated polymer. In that case, the electron transport layer 15 preferably has a lower refractive index than the light emitting layer 14 in the wavelength range of from 450 to 800 nm.

The thickness of the electron transport layer 15 is not particularly limited, but is preferably from 30 to 200 nm. The thickness of the electron transport layer 15 is, for example, 60 nm.

(Electron Injection Layer)

The electron injection layer 16 is provided between the cathode 17 and the electron transport layer 15. In a case where there is no electron transport layer 15, the electron injection layer 16 is provided between the cathode 17 and the light emitting layer 14. The electron injection layer 16 has a function to facilitate injection of electrons from the cathode 17 into the electron transport layer 15 or the light emitting layer 14. As the material for forming the electron injection layer 16, it is possible to use a commonly known one. Specific examples may be an inorganic compound such as LiF, Cs$_2$CO$_3$ or CsF, and the following Alq$_3$, PBD, TAZ, BND, OXD-7, etc., but the material is not limited thereto.

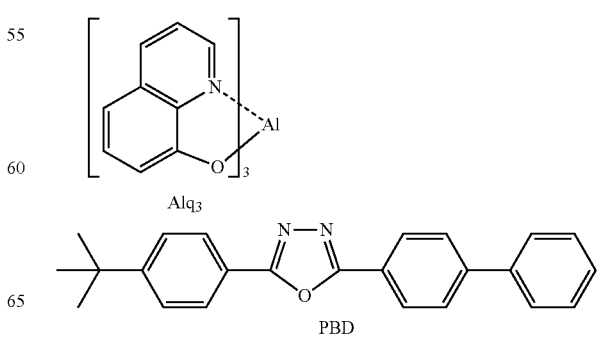

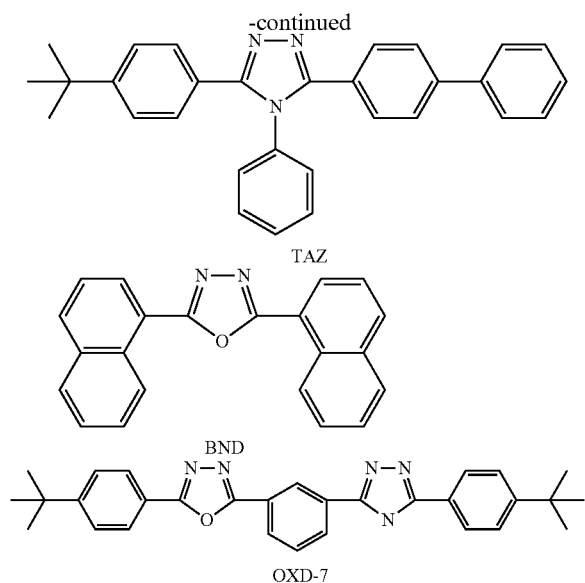

TAZ

BND

OXD-7

Further, the electron injection layer 16 may contain a fluorinated polymer as described below. In that case, the electron injection layer 16 preferably has a lower refractive index than the light emitting layer 14 in the wavelength range of from 450 to 800 nm.

Further, the electron injection layer 16 may not be formed.

The thickness of the electron injection layer 16 is not particularly limited, but is preferably from 0.5 to 2 nm. The thickness of the electron injection layer 16 is, for example, 1 nm.

(Cathode)

The cathode 17 is formed in contact with the electron injection layer 16. In a case where there is no electron injection layer 16, the cathode 17 is formed in contact with the electron transport layer 15, and in a case where there is no electron injection layer and electron transport layer 15, the cathode 17 is formed in contact with the light-emitting layer 14. The cathode 17 has a function to inject electrons into the electron injection layer 16, the electron transport layer 15 or the light emitting layer 14. As the material for forming the cathode 17, it is possible to adopt a known one. For example, as the material for forming the cathode 17, a MgAg electrode or an Al electrode may be mentioned. On the surface of the Al electrode, a buffer layer such as LiF may be formed.

Further, the cathode 17 has a function as a reflection film to reflect light L isotropically emitted in the light emitting layer 14 and direct it towards the anode 11.

The thickness of the cathode 17 is not particularly limited, but is preferably from 30 to 300 nm. The thickness of the cathode 17 is, for example, 100 nm.

As the organic EL element 1 has the above-described construction, the following effects can be obtained.

First, the hole transport layer 13 contains a fluorinated polymer so as to make the refractive index to be a low refractive index as compared with the case where the hole transport layer 13 does not contain a fluorinated polymer, whereby the light extraction efficiency is improved.

Second, the light emitting layer 14 is in contact with the hole transport layer 13 with a relatively lower refractive index than the light emitting layer 14, whereby the reflection loss inside of the element is reduced, and the light extraction efficiency is improved.

When light enters into the interface of two layers having different refractive indexes, part of the light is refracted, and the rest is reflected. Further, when light enters from a layer having a large refractive index towards a layer having a small refractive index, at the interface between the two layers, there may be a case where the total reflection takes place depending on the incident angle.

If light generated in the light emitting layer 14 is reflected at the interface 14*a* between the light emitting layer 14 and the hole transport layer 13 as shown in FIG. 1, the probability of attenuation of the reflected light in the interior of the organic EL element increases. As a result, light extraction efficiency is lowered.

Such reflection at the interface is more likely to occur as the refractive index difference between the two layers in contact with each other, is larger. Therefore, in order to suppress the interfacial reflection, it is preferred to reduce the refractive index difference between the layers.

From such a consideration, in a case where the hole transport layer contains an organic semiconductor material and a fluorinated polymer, it may be considered to be preferred that a hole transport layer containing no fluorinated polymer (hereinafter a hole transport layer A) is formed at a position in contact with the light emitting layer 14 and another hole transport layer containing an organic semiconductor material and a fluorinated polymer (hereinafter a hole transport layer B) is formed so as to be in contact with said layer, because interfacial reflection between the light emitting layer 14 and the hole transport layer can be suppressed.

However, in the case of the above construction, light entered from the light emitting layer 14 into the hole transport layer becomes easily reflected at the interface between the hole transport layer A and the hole transport layer B.

Therefore, in the construction of the present invention, it is so designed that a hole transport layer having the lowest refractive index is disposed at the position in contact with the light emitting layer 14. In such construction, it is possible to suppress the reflection at the interface between the light emitting layer 14 and the hole transport layer having the lowest low refractive index, by controlling the emission position in the light emitting layer 14.

In the light emitting layer 14, holes and electrons are recombined to emit photons. At that time, by suitably selecting the formation materials and thicknesses of the respective layers constituting the element, it is possible to control the position where holes and electrons are recombined, in the thickness direction of the light emitting layer 14. The recombination position of holes and electrons, i.e. the light emission position, can be confirmed by a known method.

In the organic EL element 1, the light emission position is set at the interface 14*a* between the light emitting layer 14 and the hole transport layer 13. Therefore, light generated is emitted towards the light emitting layer 14 and the hole transport layer 13.

At that time, the light generated enters into the light emitting layer 14 and the hole transport layer 13 without being reflected at the interface 14*a*. Therefore, for the light generated in the interface 14*a* between the light emitting layer 14 and the hole transport layer 13, it is not necessary to consider the reflection at the interface between the light emitting layer 14 and the hole transport layer 13.

Thus, in the hole transport layer 13 of the present embodiment, by setting the light emission position at the interface 14*a* between the light emitting layer 14 and the hole transport layer 13, the reflection loss inside of the element will be reduced, and the light extraction efficiency will be improved.

As described above, in the organic EL element 1 in which the hole transport layer 13 has the above construction, by the respective effects as described above, the light extraction efficiency will be improved. Thus, with less input power than conventional organic EL elements, it is possible to obtain an emission amount equivalent to by conventional organic EL elements, i.e. it is possible to obtain an organic EL element whereby the power consumption is low.

In order to verify such an effect that the hole transport layer 13 becomes to have a low refractive index as it contains a fluorinated polymer, and further, light extraction efficiency is improved when the light emitting layer 14 is in contact with the hole transport layer 13 with a relatively lower refractive index than the light emitting layer 14, the results obtained by simulation using Setfos4.6 (manufactured by Cybernet Systems Co., Ltd.) will be described. The construction of an element to be analyzed as an example of the organic EL element 1, was such that glass (thickness 1 mm) was used as the substrate 10, ITO (thickness 100 nm) was used as the anode 11, HAT-CN (thickness 10 nm) was used as the hole injection layer 12, as the light emitting layer 14, Ir(ppy)$_3$ was used as a light emitting guest and 4,4'-bis (9H-carbazol-9-yl) biphenyl (CBP) (thickness 30 nm) was used as a light emitting host, TPBi was used as the electron transport layer 15, LiF (thickness 0.8 nm) was used as the electron injection layer 16, and Al (thickness 100 nm) was used as the cathode 17. With respect to the hole transport layer 13, a construction in which a low refractive index hole transport layer (refractive index at a wavelength of 550 nm is 1.55) was used as the hole transport layer, was adopted in Examples 1 to 3, a construction in which an α-NPD layer (refractive index at a wavelength of 550 nm is 1.77) was used as the hole transport layer, was adopted in Comparative Examples 1 to 3 and a double layer construction of an α-NPD layer (thickness 10 nm) and a low refractive index hole transport layer (construction in which the α-NPD layer is in contact with the light emitting layer) was adopted in Comparative Examples 4 to 6. With respect to the light emitting layer, three conditions were set such that the light emission point in the light emitting layer was at the intermediate (light emission point 0.5), at the hole transport layer side (light emission point 0.1), and at the electron transport layer side (light emission point 0.9), in the light emitting layer, and the film thickness of the electron transport layer 15 and the film thickness of the hole transport layer 13 were swept at 5 nm intervals in the range of from 10 nm to 100 nm, whereby conditions under which light extraction efficiency becomes to be maximum, were calculated. The results of the analysis are shown in Table 1.

TABLE 1

| First embodiment | Electron transport layer | Light emitting layer | | Hole transport layer (located between light emitting layer and low refractive index hole transport layer) | Low refractive index hole transport layer | Light extraction efficiency |
|---|---|---|---|---|---|---|
| Bottom emission | Thickness nm | Light emission point | Thickness nm | Thickness nm | Thickness nm | (maximum value) |
| Example 1 | 50 | 0.5 | 30 | 0 | 55 | 30% |
| Example 2 | 40 | 0.1 | 30 | 0 | 65 | 31% |
| Example 3 | 60 | 0.9 | 30 | 0 | 40 | 28% |
| Comparative Example 1 | 55 | 0.5 | 30 | 30 | 0 | 25% |
| Comparative Example 2 | 45 | 0.1 | 30 | 40 | 0 | 25% |
| Comparative Example 3 | 65 | 0.9 | 30 | 20 | 0 | 25% |
| Comparative Example 4 | 50 | 0.5 | 30 | 10 | 40 | 28% |
| Comparative Example 5 | 40 | 0.1 | 30 | 10 | 55 | 30% |
| Comparative Example 6 | 60 | 0.9 | 30 | 10 | 30 | 27% |

In Comparative Examples 1 to 3 in Table 1, the light extraction efficiency was 25% regardless of the light emission point in the light emitting layer, and in Examples 1 to 3, the light extraction efficiency was at least 28%, whereby such an effect has been confirmed that by making the hole transport layer 13 to have a low refractive index, the light extraction efficiency was improved. Further, when Examples 1 to 3 and Comparative Examples 4 to 6 are compared under a condition where the light emitting point is the same, the light extraction efficiency is higher in Examples 1 to 3, and thus, such an effect has been confirmed that as a low refractive index hole transport layer was adjacent to the light emitting layer, the light extraction efficiency was improved.

Further, in the organic EL element 1 in which the hole transport layer 13 has the above-described construction, the input power is reduced as described above. Therefore, the organic EL element 1 is less likely to be deteriorated and will be one having the service life prolonged.

According to the organic EL device 1 having the above-described construction, the external quantum efficiency will be improved, the power consumption will be less, and the service life will be prolonged.

Second Embodiment

Figure 2:
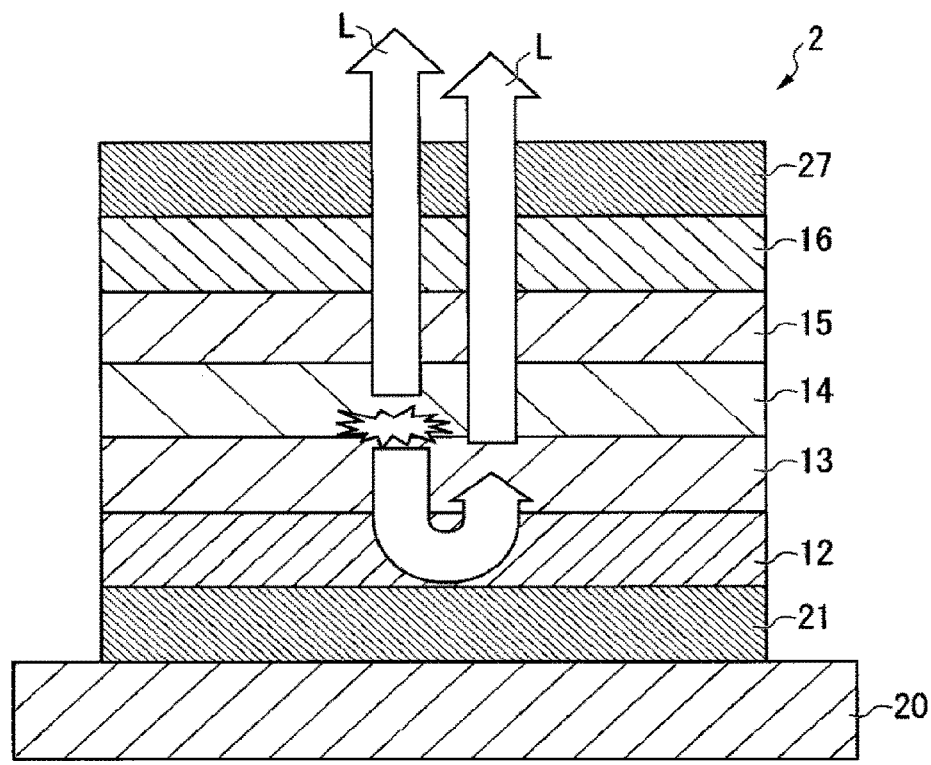
FIG. 2 is a schematic cross-sectional view showing an organic EL element 2 according to the second embodiment.

FIG. 2 is a schematic cross-sectional view showing an organic EL element 2 according to a second embodiment of the present invention, and is a view corresponding to FIG. 1. Therefore, in this embodiment, for the components common to the first embodiment, the same reference numerals are given, and the detailed descriptions thereof are omitted.

The organic EL element 2 has a structure in which a substrate 20, an anode 21, a hole injection layer 12, a hole transport layer 13, a light emitting layer 14, an electron transport layer 15, an electron injection layer 16 and a cathode 27 are laminated in this order. The organic EL element 2 in this embodiment adopts a top emission system in which light L generated in the light emitting layer 14 is emitted to the outside via the cathode 27.

The substrate 20 may be provided with optical transparency, or may not be provided with optical transparency. As the material for forming the substrate 20, it is possible to use an inorganic material such as glass, quartz glass or silicon nitride, or an organic polymer (resin) such as an acrylic resin or a polycarbonate resin. Further, so long as the insulating property of the surface is secured, it is also possible to employ a metal material as the material for forming the substrate 20.

The anode 21 is formed on the substrate 20 and supplies holes to the hole transport layer 13. Further, the anode 21 has light reflectivity to reflect light emitted from the light emitting layer 14. As the material for forming the anode 21, it is possible to use an electrically conductive metal oxide having optical transparency, such as ITO or IZO. Further, in order to impart light reflectivity to the anode 21, on the substrate 20 side of the anode 21, a reflective film made of a metal material as the forming material is provided. That is, the anode 21 has a layered structure of a layer of an electrically conductive metal oxide as the forming material and the reflective film.

Further, it is also possible to use silver as the material for forming the anode 21.

The cathode 27 is formed in contact with the electron injection layer 16. The cathode 27 is, as a whole, a semitransmissive membrane formed to be thin to such an extent to reflect part of light emitted from the light emitting layer 14, and transmit the rest. As the material for forming the cathode 27, a MgAg electrode or an Al electrode may be mentioned.

The thickness of the cathode 27 is not particularly limited, but is preferably from 5 to 30 nm. The thickness of the cathode 27 is, for example, 5 nm.

(Microcavity Structure)

In the organic EL element 1 of this embodiment, the anode 11 and the cathode 17 constitute a light resonator structure (microcavity) that resonates light between the anode 11 and the cathode 17. Between the anode 11 and the cathode 17, light generated in the light emitting layer 14 is repeatedly reflected, and light having a wavelength that matches the optical path length between the anode 11 and the cathode 17 is resonated and amplified. On the other hand, light having a wavelength that does not match the optical path length between the anode 11 and the cathode 17 is attenuated.

Here, the "optical path length" shall be calculated by using the desired wavelength of light emitted to the outside of the element and the refractive index of each layer in the wavelength of the desired light.

The optical path length between the anode 11 and the cathode 17 is, for example, set to be an integral multiple of the center wavelength of the light L generated by the light emitting layer 14. In that case, the light L emitted by the light emitting layer 14 will be emitted to the outside of the organic EL element 1 as amplified as it is closer to the center wavelength, or as attenuated as it departs from the center wavelength. In this way, the light L emitted from the organic EL element 1, becomes to be one, of which the half value width of the light emission spectrum is narrow, and the color purity is improved.

The microcavity structure utilizes resonance by fixed end reflections at both ends being the cathode and the anode. Therefore, in a case where "the optical path length from the light emission position to the anode, is an integral multiple of ¼ of the wavelength λ of the desired light emitted to the outside of the element" and "the optical path length from the light emission position to the cathode, is an integral multiple of ¼ of the wavelength λ of the desired light emitted to the outside of the element", it is possible to form the desired micro-cavity structure.

Also in the organic EL element 2 having such a contraction, in the same manner as in the organic EL element 1 shown in the first embodiment, it is possible to improve light extraction efficiency, by making the refractive index to be a low refractive index as compared with the case where the hole transport layer 13 does not contain a fluorinated polymer.

Further, since the hole transport layer 13 is a layer, of which the refractive index is low as compared with a layer made of only an organic semiconductor material, it is easy to adjust the optical path length inside of the element by adjusting the thickness of the hole transport layer 13.

That is, the hole transport layer 13 is less influential to the optical path length, even if the thickness is deviated from the target value, as compared to the case where the thickness is deviated in a layer using only an organic semiconductor material and having a relatively high refractive index. Accordingly, in the organic EL element 1 having the above-described hole transport layer 13, it is easy to control the optical path length inside of the element, and it is easy to improve the color purity of light emitted by the above-described microcavity structure.

Further, since the light emitting layer 14 and the hole transport layer 13 having a relatively lower refractive index than the light emitting layer 14, are in contact to each other, the reflection loss inside of the element will be lowered, and the light extraction efficiency will be improved.

Also by the organic EL element 2 constructed as described above, the external quantum efficiency will be improved, the power consumption will be less, and the service life will be prolonged.

In order to verify such an effect that the hole transport layer 13 becomes to have a low refractive index as it contains a fluorinated polymer, and further, light extraction efficiency is improved when the light emitting layer 14 is in contact with the hole transport layer 13 with a relatively lower refractive index than the light emitting layer 14, the results obtained by simulation using Setfos4.6 (manufactured by Cybernet Systems Co., Ltd.) will be described. The construction of an element to be analyzed as an example of the organic EL element 2, was such that glass (thickness 1 mm) was used as the substrate 20, Ag (thickness 100 nm) was used as the anode 21, HAT-CN (thickness 5 nm) was used as the hole injection layer 12, as the light emitting layer 14, Ir(ppy)$_3$ was used as a light emitting guest and CBP (thickness 20 nm) was used as a light emitting host, Alq$_3$ was used as the electron transport layer 15, LiF (thickness 0.8 nm) was used as the electron injection layer 16, and Al (thickness 10 nm) was used as the cathode 27. With respect to the hole transport layer 13, a construction in which a low refractive index hole transport layer (refractive index at a wavelength of 550 nm is 1.56) was used as the hole transport layer, was adopted in Examples 4 to 9, a construction in which an α-NPD layer (refractive index at a wavelength of 550 nm is 1.77) was used as the hole transport layer, was adopted in Comparative Examples 7 to 12 and a double layer construction of an α-NPD layer (thickness 10 nm) and a low refractive index hole transport layer (construction in which the α-NPD layer is in contact with the light emitting layer) was adopted in Comparative Examples 13 to 18. With respect to the light emitting layer, three conditions were set such that the light emission point in the light emitting layer was at the intermediate (light emission point 0.5), at the hole transport layer side (light emission point 0.9), and at the electron transport layer side (light emission point 0.1), in the light emitting layer, the film thickness of the electron transport layer 15 was swept at 30 nm intervals in the range of from 50 nm to 230 nm, and the film thickness of the hole transport layer 13 was swept at 30 nm intervals in the range of from 10 nm to 280 nm, whereby conditions under which light extraction efficiency becomes to be maximum, at the thin film side (primary resonance) and at the thick film side (secondary resonance) of the hole transport layer 13, were calculated. The results of the analysis are shown in Table 2.

TABLE 2

| Second embodiment Top emission | Electron transport layer Thickness nm | Light emitting layer Light emission point | Thickness nm | Hole transport layer (located between light emitting layer and low refractive index hole transport layer) Thickness nm | Low refractive index hole transport layer Thickness nm | Light extraction efficiency (maximum value) |
|---|---|---|---|---|---|---|
| Example 4 | 140 | 0.5 | 20 | 0 | 70 | 30% |
| Example 5 | 140 | 0.5 | 20 | 0 | 250 | 29% |
| Example 6 | 140 | 0.9 | 20 | 0 | 70 | 31% |
| Example 7 | 140 | 0.9 | 20 | 0 | 250 | 31% |
| Example 8 | 170 | 0.1 | 20 | 0 | 40 | 16% |
| Example 9 | 170 | 0.1 | 20 | 0 | 220 | 14% |
| Comparative Example 7 | 110 | 0.5 | 20 | 70 | 0 | 22% |
| Comparative Example 8 | 170 | 0.5 | 20 | 190 | 0 | 26% |
| Comparative Example 9 | 110 | 0.9 | 20 | 70 | 0 | 24% |
| Comparative Example 10 | 140 | 0.9 | 20 | 220 | 0 | 26% |
| Comparative Example 11 | 140 | 0.1 | 20 | 40 | 0 | 14% |
| Comparative Example 12 | 170 | 0.1 | 20 | 190 | 0 | 13% |
| Comparative Example 13 | 140 | 0.5 | 20 | 10 | 40 | 28% |
| Comparative Example 14 | 140 | 0.5 | 20 | 10 | 220 | 29% |
| Comparative Example 15 | 110 | 0.9 | 20 | 10 | 70 | 29 |
| Comparative Example 16 | 140 | 0.9 | 20 | 10 | 250 | 29 |
| Comparative Example 17 | 140 | 0.1 | 20 | 10 | 40 | 16 |
| Comparative Example 18 | 170 | 0.1 | 20 | 10 | 220 | 13 |

In Table 2, from comparison among Examples 4 and 5, and Comparative Examples 7, 8, 13 and 14, in which the light emitting point was at the intermediate (light emitting point 0.5), it has been confirmed that light extraction efficiency was high in Examples 4 and 5, in which the light emitting layer and the low refractive index hole transport layer were adjacent. Further, also from comparison among Examples 6 and 7, and Comparative Examples 9, 10, 15 and 16, in which the light emitting point was at the hole transport layer side of the light-emitting layer (light emitting point 0.9), it has been confirmed that light extraction efficiency was high in Examples 6 and 7 in which the light emitting layer and the low refractive index hole transport layer, were adjacent. Still further, also from comparison among Examples 8 and 9, and Comparative Examples 11, 12, 17 and 18, in which the light emitting point was at the electron transport layer side (light emission point 0.1), it has been confirmed that light extraction efficiency was slightly high in Examples 8 and 9 in which the light emitting layer and the low refractive index hole transport layer were adjacent.

Third Embodiment

Figure 3:
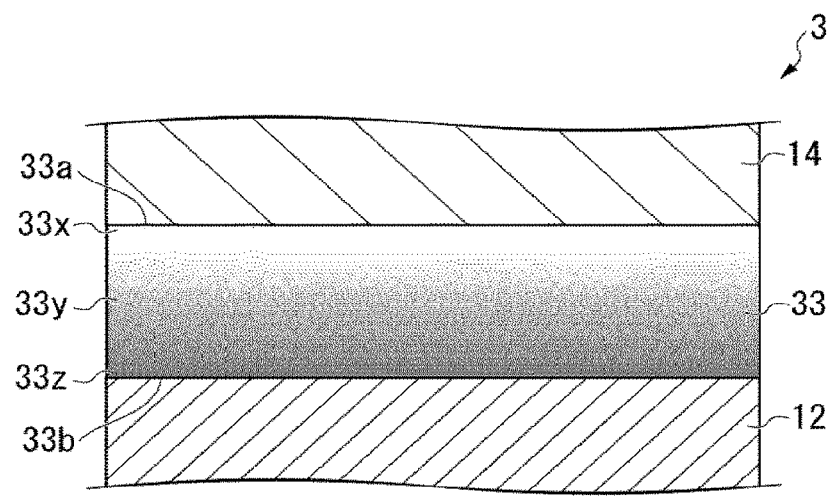
FIG. 3 is an illustrative view of an organic EL element 3 according to the third embodiment.

FIG. 3 is an illustrative view of an organic EL element 3 according to a third embodiment of the present invention, and is an enlarged view illustrating in detail a hole transport layer 33, which the organic EL element 3 has. Further, the organic EL element 3 is assumed to be of a bottom emission system like the organic EL element 1 of the first embodiment.

The organic EL element 3 has a hole transport layer 33 which is sandwiched between the hole injection layer 12 and the light emitting layer 14.

The refractive index of the hole transport layer 33 is continuously changed and gradually increased towards the hole injection layer 12 side (anode 11 side) from the light emitting layer 14. In the FIG., the refractive index of the hole transport layer 33 is represented by shading of the coloring of the hole transport layer 33. A darkly colored portion of the hole transport layer 33 indicates a high refractive index, and a thinly colored portion of the hole transport layer 33 indicates a low refractive index.

Here, the change in refractive index being "continuous" means that in the hole transport layer 33, no boundary different in refractive index is detected. For example, if two layers of hole transport layer different in refractive index are laminated, a boundary different in refractive index can be detected at the interface of the two layers, and such does not correspond to the above "continuous".

The refractive index being "gradually increased" means that the refractive index is "progressively increased". Unless the refractive index will not be reduced, a region where the refractive index does not change, may be contained in the thickness direction of the hole transport layer 33.

Of the hole transport layer 33, the refractive index of a region 33x in the vicinity of the surface 33a on the light emitting layer 14 side is low, and the refractive index of a region 33z in the vicinity of the surface 33b on the hole injection layer 12 side is high. Of a region 33y in the vicinity of the center in the thickness direction of the hole transport layer 33, the refractive index is, for example, at a level of about the middle of the region 33x and the region 33z.

The refractive index difference at the interface of the hole injection layer 12 and the hole transport layer 33 should better be small. As such a refractive index difference is small, it is possible to reduce a loss by reflection (intramembrane propagation).

In the refractive index distribution in the hole transport layer 33, the lowest refractive index is a refractive index in the wavelength range of from 450 nm to 800 nm of preferably at most 1.60, more preferably at most 1.55. When the refractive index of the hole transport layer 33 is at most 1.60, the light extraction efficiency of the organic EL element 3 will be improved. On the other hand, the lowest refractive index in the hole transport layer 33 is, from the viewpoint of securing electrical conductivity, preferably at least 1.3, more preferably at least 1.4.

Further, the position where the refractive index becomes lowest in the hole transport layer 33 is preferably adjusted by optical calculation to a position where the light extraction efficiency becomes highest, or a position where the color purity becomes highest, or an optimal position in view of the balance of both of them.

By the organic EL element 3 having the hole transport layer 33 of the above construction, in addition to the effects which the organic EL element 1 of the first embodiment has, it is possible to suppress the reflection of light at the interface between the hole injection layer 12 and the hole transport layer 33 and the reflection inside of the hole transport layer 33.

When light enters into the interface of two layers different in refractive index, part of the light will be refracted, and the rest will be reflected. Further, when light enters from a layer having a large refractive index towards a layer having a small refractive index, at the interface between the two layers, there is a case where the total reflection occurs depending upon the incident angle.

If light generated in the light emitting layer 14 is reflected at the interface between the hole injection layer 12 and the hole transport layer 33, such probability that the reflected light is attenuated in the interior of the organic EL element, will increase. As a result, light extraction efficiency will be lowered.

Such reflection at the interface is more likely to occur as the refractive index difference is larger between the two layers in contact with each other. Therefore, in order to suppress the interfacial reflection, it is preferred to reduce the refractive index difference between the layers.

In this respect, in the organic EL element 3 in this embodiment, the refractive index difference at the interface between the hole injection layer 12 and the hole transport layer 33 is designed to become small, whereby the reflection at the interface is suppressed.

Further, in order to make the refractive index difference small at the interface between the hole injection layer 12 and the hole transport layer 33, the construction is such that at the inside of the hole transport layer 33, the refractive index is continuously varied, so that an interface where the refractive index change becomes discontinuous will not be formed, and thus, the reflection inside the hole transport layer 33 is suppressed.

Therefore, it is possible to suppress the internal reflection of light emitted from the light emitting layer 14, thereby to improve the light extraction efficiency.

Figure 4A:
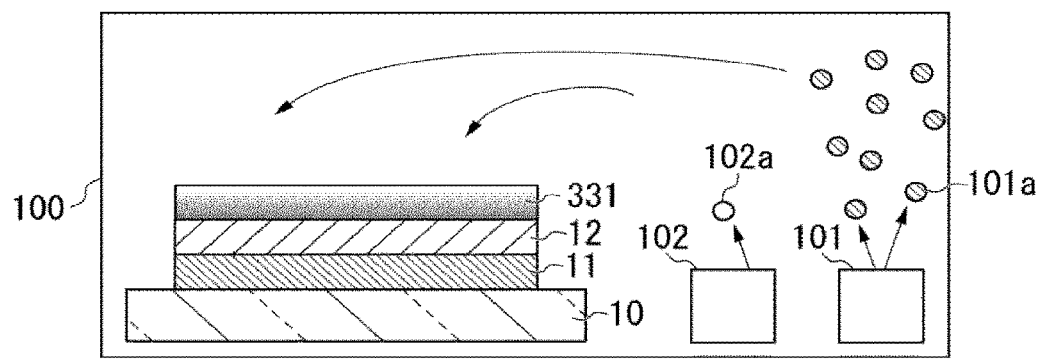
FIG. 4A is a schematic view illustrating a process step of producing the hole transport layer 33 of the organic EL element 3.
Figure 4B:
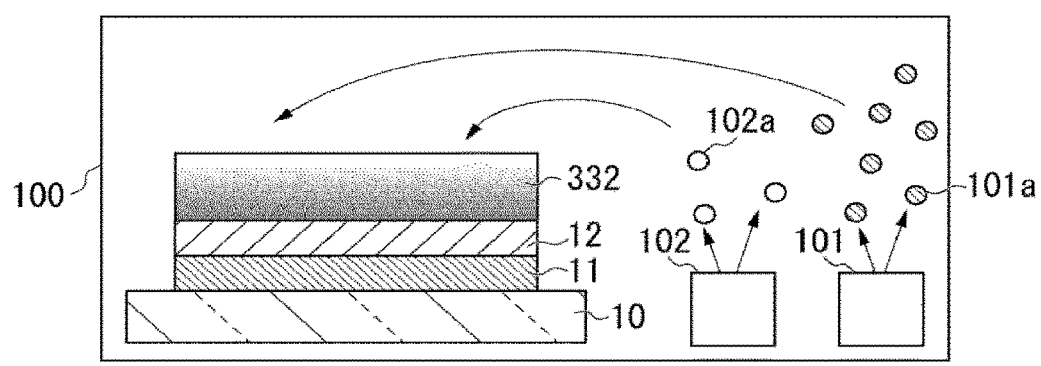
FIG. 4B is a schematic view illustrating a process step of producing the hole transport layer 33 of the organic EL element 3.
Figure 4C:
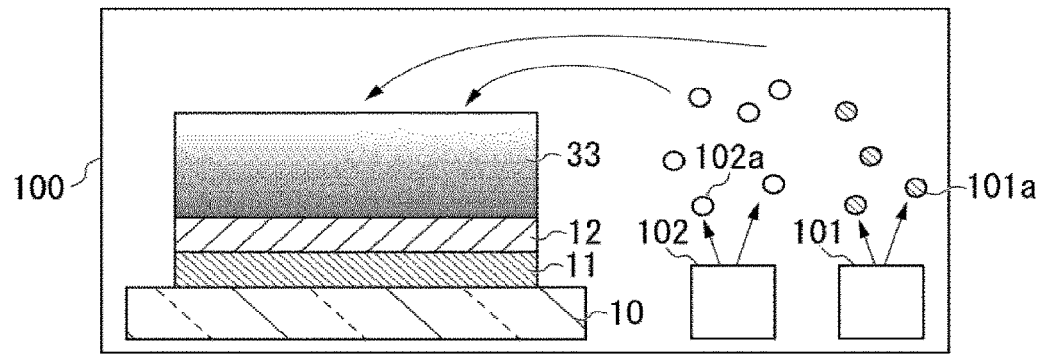
FIG. 4C is a schematic view illustrating a process step of producing the hole transport layer 33 of the organic EL element 3.

FIG. 4A to FIG. 4C are schematic views showing the process steps for producing the above-described hole transport layer 33 of the organic EL element 3.

FIG. 4A shows a state of forming the region 33z of the hole transport layer 33. First, as shown in FIG. 4A, a substrate 10 having the anode 11 and the hole injection layer 12 formed, is prepared. Such a substrate 10 is placed in the chamber 100 of a vacuum vapor deposition apparatus, and from a vapor deposition source 101 of an organic semiconductor material and a vapor deposition source 102 of a fluorinated polymer, an organic semiconductor material 101a and a fluorinated polymer 102a are supplied and co-vapor deposited. In the FIG., the respective vapor deposition amounts of the organic semiconductor material 101a and the fluorinated polymer 102a are represented by graphic amounts illustrating the organic semiconductor material 101a and the fluorinated polymer 102a. By reducing the vapor deposition proportion of the fluorinated polymer 102a, the refractive index of the obtainable film 331 becomes high.

FIG. 4B shows a state of forming the region 33y of the hole transport layer 33.

As shown in FIG. 4B, by adjusting at least one of the heating temperatures for the vapor deposition sources 101 and 102 and the opening degrees of the lids for the vapor deposition sources 101 and 102, the vapor deposition ratio of the semiconductor material and the fluorinated polymer is changed, whereby both materials are co-vapor deposited. Specifically, as compared with the step of forming the region 33z, the vapor deposition rate of the fluorinated polymer is increased, and the vapor deposition rate of the organic semiconductor material is decreased. Thus, the content of the fluorinated polymer is increased from FIG. 4A, and the refractive index of the obtainable film 332 will be gradually lowered.

FIG. 4C shows a state of forming the region 33x of the hole transport layer 33.

As shown in FIG. 4C, for example, as compared to the step of forming the region 33y, the vapor deposition rate of the fluorinated polymer is increased and the vapor deposition rate of the organic semiconductor material is decreased. Thus, the content of the fluorinated polymer is increased from FIG. 4B, and it is possible to obtain the hole transport layer 33 in which the refractive index is further lowered in the vicinity of the surface.

In forming the hole transport layer 33, so that the refractive index change of the obtainable hole transport layer 33 becomes a continuous one, the control of changing the vapor deposition rate shown in the above-described FIG. 4A to FIG. 4C is conducted continuously.

Figure 5A:
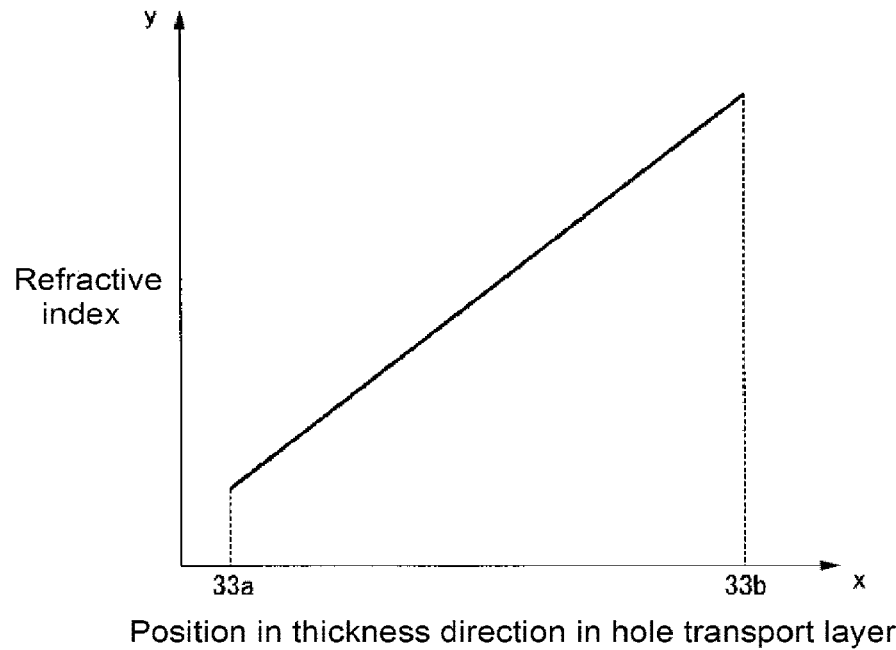
FIG. 5A is an illustrative view illustrating a change in refractive index in the hole transport layer 33.
Figure 5B:
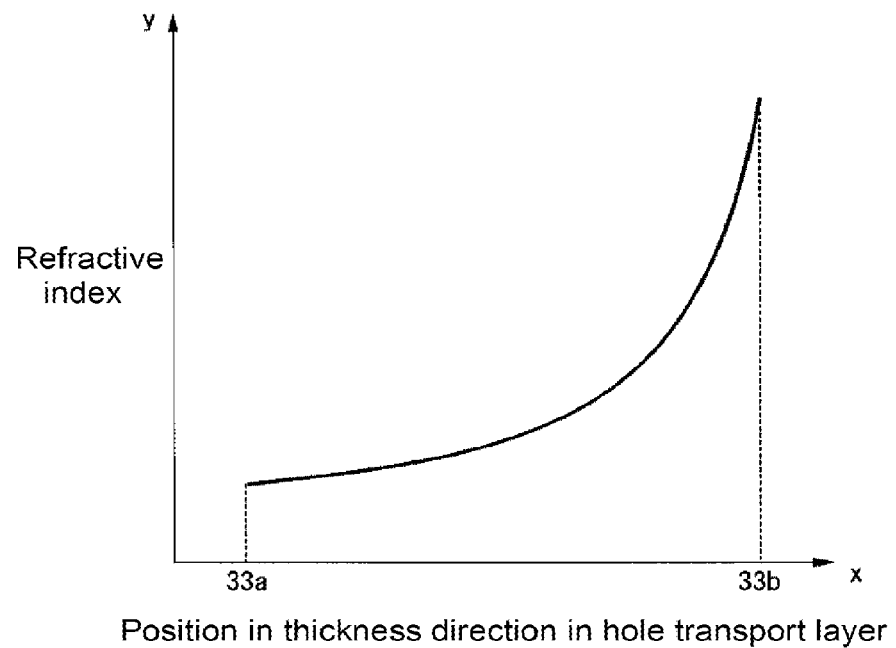
FIG. 5B is an illustrative view illustrating a change in refractive index in the hole transport layer 33.

FIG. 5A and FIG. 5B are illustrative views for illustrating a change in refractive index of the hole transport layer 33 obtainable by the above method. In FIG. 5A and FIG. 5B, the horizontal axis indicates a position in the thickness direction of the hole transport layer 33. 33a and 33b shown in the horizontal axis, represent the surface 33a and the surface 33b of the hole transport layer 33 as described above. The vertical axis represents the refractive index at the position in the thickness direction of the hole transport layer.

In each of FIG. 5A and FIG. 5B, the refractive index is continuously changed from the surface 33a (light emitting layer 14 side) towards the surface 33b (the anode 11 side) of the hole transport layer 33, and the refractive index is gradually increased.

As shown in FIG. 5A, the refractive index of the hole transport layer 33 may be made to be varied linearly from the surface 33a towards the surface 33b of the hole transport layer 33. In the following description, the hole transport layer 33 undergoing the refractive index change as shown in FIG. 5A will be referred to as a hole transport layer 33a.

In this case, the hole transport layer 33a can be produced by increasing the vapor deposition rate of the organic semiconductor material at a constant rate, and decreasing the vapor deposition rate of the fluorinated polymer at the same rate, whereby the control of the production process will be easy.

Further, as shown in FIG. 5B, the refractive index of the hole transport layer 33 may be made to be gradually increased closer to the surface 33a of the hole transport layer 33, and then changed to be rapidly increased towards the surface 33b. In the following description, the hole transport layer 33 undergoing the refractive index change as shown in FIG. 5B will be referred to as a hole transport layer 333.

In this case, if the thickness of the hole transport layer 3313 is assumed to be the same as of the hole transport layer 33a shown in FIG. 5A, the amount of fluorinated polymer contained in the hole transport layer 33p becomes larger than in the hole transport layer 33a. Therefore, the average refractive index of the entire hole transporting layer 3313 becomes smaller than the average refractive index of the entire hole transporting layer 33a, whereby light extraction efficiency is improved over the hole transport layer 33a.

Further, the refractive index of the hole transport layer 33 may be made to be gradually decreased closer to the surface 33a of the hole transport layer 33, and then changed to be gradually decreased toward the surface 33b.

Thus, in this embodiment, by controlling the vapor deposition rate at the time of co-vapor deposition, it is possible to easily form a hole transport layer 33 in which the refractive index is continuously changed.

Also in such organic EL element, in addition to the effects described in the first embodiment and the second embodiment, since the hole transport layer is a single layer, a reflection loss inside of the hole transport layer will not result, and light extraction efficiency will be improved.

Also by the organic EL element 3 constructed as described above, the external quantum efficiency will be improved, the power consumption will be less, and the service life will be prolonged.

In this embodiment, although the organic EL element 3 has been described as it has a construction of a bottom emission system, it is also possible to apply a top emission system.

The above-described organic photoelectronic element of this embodiment can be utilized for an organic photoelectronic device such as an organic EL device, a solar cell, an organic photodiode, an organic laser, etc.

Especially the organic photoelectronic element of this embodiment is suitably used as an organic EL element. Such an organic EL element can be utilized for an organic EL device such as an organic EL display or an organic EL illumination. Such an organic EL device may be a top emission type, or may be a bottom emission type.

"Measurement of Refractive Index of Charge Transport Layer"

By using a multi incidence angle spectroscopic ellipsometry (manufactured by J.A. Woollam Co., Inc.: M-2000U), with respect to a film on a silicon substrate, measurements were conducted by changing the incident angle of light by 5 degrees each time, in the range of from 45 to 75 degrees. At each angle, LP and A being ellipsometry parameters were measured at about 1.6 nm intervals in the wavelength range of from 450 nm to 800 nm. Using the above measurement data, the dielectric function of the organic semiconductor was subjected to a fitting analysis by Cauchy model to obtain the thickness of the charge transport layer, and the refractive index of the charge transport layer to light having each wavelength.

Abbreviations of the monomers, solvents and polymerization initiators used in the preparation of the following fluorinated polymers are as follows.

BVE: perfluoro(3-butenyl vinyl ether)
TFE: tetrafluoroethylene
PPVE: perfluoro(n-propyl vinyl ether) ($CF_2$=$CFOCF_2CF_2CF_3$)
1H-PFH: 1,1,1,2,2,3,3,4,4,5,5,6,6-tridecafluorohexane
IPP: diisopropyl peroxydicarbonate
AlBN: azobisisobutyronitrile <Synthesis of Polymer A>

30 g of BVE, 30 g of 1H-PFH, 0.5 g of methanol and 0.44 g of IPP were put in a glass reactor having an inner volume of 50 ml. After replacing inside of the system with high purity nitrogen gas, polymerization was conducted at 40° C. for 24 hours. The obtained solution was subjected to solvent removal under conditions of 666 Pa (absolute pressure) and 50° C., to obtain 28 g of a polymer. The intrinsic viscosity [η] of the obtained polymer was 0.04 dl/g.

Then, by the method described in paragraph [0040] in JP-A-H11-152310, the obtained polymer was subjected to replacement of unstable terminal groups to —$CF_3$ groups by fluorine gas to obtain polymer A.

Of the obtained polymer A, the refractive index to light having a wavelength of 600 nm was 1.34, the intrinsic viscosity [η] was 0.04 dl/g. Of the polymer A, Mw was 9,000, Mn was 6,000, Mw/Mn was 1.5, the saturated vapor pressure at 300° C. was 0.002 Pa, and the evaporation rate at 300° C. was 0.08 g/m² sec.

<Synthesis of Polymer B>

Into a stainless steel autoclave having an internal volume of 1,006 mL, 152.89 g of PPVE, 805.0 g of AC2000, 2.400 g of methanol and 1.149 g of AIBN were charged and freeze-deaerated with liquid nitrogen. After the temperature was raised to 70° C., TFE was introduced until the pressure became 0.57 MPaG. While maintaining the temperature and pressure to be constant, TFE was continuously supplied and polymerized. After 9 hours from the initiation of polymerization, the autoclave was cooled to stop the polymerization reaction, and the gas in the system was purged to obtain a solution of a fluorinated polymer.

813 g of methanol was added to and mixed with the solution of the fluorinated polymer, whereupon the lower layer in which the fluorinated polymer was dispersed, was recovered. The obtained dispersion of the fluorinated polymer was hot-air dried at 80° C. for 16 hours and then vacuum-dried at 100° C. for 16 hours, to obtain 18.92 g of the fluorinated polymer.

The composition of the fluorinated polymer was PPVE: TFE=14:86 mol %.

Then, the obtained fluorinated polymer was heated in an oven of 330° C. for 5 hours, immersed in methanol, and heated in an oven of 75° C. for 20 hours, to replace unstable terminal groups to methyl ester groups thereby to obtain fluorinated polymer B. Mw and Mn of the fluorinated polymer B obtained in the above method cannot be measured, and therefore, instead, the relation between the elastic modulus and temperature of the polymer B is shown in FIG. 8.

Of the obtained polymer B, the refractive index to light having a wavelength of 600 nm was 1.34, and the evaporation rate was 0.04 g/m² sec.

<Preparation of Organic EL Element A>

As a substrate for preparing an organic EL element A, a glass substrate having ITO (indium tin oxide) film-deposited in a strip shape with a width of 2 mm, was used. This substrate was subjected to ultrasonic cleaning with a neutral detergent, acetone and isopropanol, and further boil-washed in isopropanol, whereupon by the ozone treatment, deposits on the ITO film surface were removed. This substrate was placed in a vacuum vapor deposition machine and evacuated to a pressure of at most $10^{-4}$ Pa, whereupon 10 nm of HAT-CN as the hole injection layer 12, 30 nm of Tris-PCz as the hole transport layer 13, 30 nm of a co-deposition film of 3,3'-di(9H-carbazol-9-yl)-1,1'-biphenyl (mCBP) and Ir(ppy)$_3$ as the light emitting layer 14, 50 nm of TPBi as the electron transport layer 15, 0.8 nm of LiF as the electron injection layer 16, and 100 nm of Al as the cathode 17, were, respectively, laminated, to obtain an organic EL element A. The co-vapor deposition film of the light emitting layer 14 was film-formed by controlling the vapor deposition rates of mCBP and Ir(ppy)$_3$ so that Ir(ppy)$_3$ concentration would become 6 wt %.

<Preparation of Organic EL Element B>

Prepared in the same manner as the organic EL element A, except that as the hole transport layer 13, a co-vapor deposition film of Tris-PCz and polymer A was film-formed in a volume ratio of 50:50 in a thickness of 50 nm.

<Preparation of Organic EL Element C>

Prepared in the same manner as the organic EL element A, except that as the hole transport layer 13, a co-vapor deposition film of Tris-PCz and polymer B was film-formed in a volume ratio of 50:50 in a thickness of 50 nm.

Example 10

A silicon substrate cut into an about 2 cm square was subjected to ultrasonic cleaning with a neutral detergent, acetone and isopropanol, and further boil-washed in isopropanol, whereupon by the ozone treatment, deposits on the substrate surface were removed. This substrate was placed in a vacuum vapor deposition machine, and evacuated to a pressure of at most $10^{-4}$ Pa, whereupon the polymer A and Tris-PCz were subjected to resistance heating and co-vapor deposition in the vacuum vapor deposition machine, so that the volume ratio would become 50:50, to prepare a hole transport layer having a thickness of about 100 nm on the substrate. The refractive index to light having a wavelength of 600 nm of the obtained hole transport layer was 1.55.

Example 11

A hole transport layer was film-formed in the same manner as in Example 10, except that instead of the polymer A, the polymer B was used. The refractive index to light having a wavelength of 600 nm of the obtained hole transport layer was 1.55.

Comparative Example 19

A hole transport layer was film-formed in the same manner as in Example 10, except that as the hole transport layer, only Tris-PCz was film-deposited in a thickness of about 100 nm. The refractive index to light having a wavelength of 600 nm of the obtained hole transport layer was 1.84.

From Example 10, Example 11 and Comparative Example 19, it has been confirmed that by co-vapor depositing Tris-PCz and the fluorinated polymer so that the volume ratio would become 50:50, the refractive index was lowered from 1.84 to 1.55.

Example 12

By applying a voltage to the organic EL element B, the current efficiency and power efficiency at a constant current of 0.2 mA/cm² were measured, whereby the current efficiency was 72 cd/A, and the power efficiency was 51 lm/W.

Example 13

By applying a voltage to the organic EL element C, the current efficiency and power efficiency at a constant current of 0.2 mA/cm² were measured, whereby the current efficiency was 73 cd/A, and the power efficiency was 53 lm/W.

Comparative Example 20

By applying a voltage to the organic EL element A, the current efficiency and power efficiency at a constant current of 0.2 mA/cm² were measured, whereby the current efficiency was 64 cd/A, and the power efficiency was 43 lm/W.

From the results in Examples 10 to 13 and Comparative Examples 19 to 20, it has been confirmed that the current efficiency and power efficiency of an element using a hole transport layer 13 containing a fluorinated polymer become to be a higher current efficiency and power efficiency as compared to an element using a hole transport layer containing no fluorinated polymer. This improvement in the efficiencies is considered to be a result attributable to the fact that the light extraction efficiency is improved since the hole transport layer 13 having a low refractive index is adjacent to the light emitting layer 14.

In the foregoing, preferred embodiments according to the present invention have been described with reference to the accompanying drawings, but needless to say, the present invention is not limited to such embodiments. The shapes and combinations of the components shown in the above-described embodiments are merely exemplary, and various modifications are possible based on design requirements without departing from the scope of the present invention.

This application is a continuation of PCT Application No. PCT/JP2018/031241, filed on Aug. 23, 2018, which is based upon and claims the benefit of priority from Japanese Patent Application No. 2017-161642 filed on Aug. 24, 2017. The contents of those applications are incorporated herein by reference in their entireties.

REFERENCE SYMBOLS 10, 20: substrate, 11, 21: anode, 12: hole injection layer, 13: hole transport layer, 14: light emitting layer, 15: electron transport layer, 16: electron injection layer, 17, 27: cathode, 101a: organic semiconductor material, 102a: fluorinated polymer, L: light

What is claimed is:

1. An organic photoelectronic element comprising
a substrate,
an anode provided on the substrate,
a cathode facing the anode,
a light emitting layer disposed between the anode and the cathode, a hole transport layer provided in contact with the light emitting layer between the light emitting layer and the anode, wherein the hole transport layer contains an organic semiconductor material and a fluorinated polymer, and at the surface of the hole transport layer in contact with the light emitting layer, the fluorinated polymer is present;

wherein the fluorinated polymer is (i) a polymer which does not have an aliphatic ring and has units derived from a fluoroolefin, or (ii) a polymer which has an aliphatic ring structure in the main chain, and wherein the fluorinated polymer has an evaporation rate of at least 0.01 g/m$^2$ sec at 300° C. in a vacuum degree of $1 \times 10^{-3}$ Pa;

wherein the fluorinated polymer does not comprise vinylidene fluoride units.

2. The organic photoelectronic element according to claim 1, which further has a hole injection layer which is disposed between the hole transport layer and the anode and which contains a semiconductor material and a fluorinated polymer.

3. The organic photoelectronic element according to claim 1, wherein in the hole transport layer, the refractive index is continuously increasing toward the anode from the light emitting layer.

4. The organic photoelectronic element according to claim 1, which further has a functional layer disposed between the cathode and the light emitting layer, wherein the functional layer has at least one of an electron transport layer and an electron injection layer, and contains a semiconductor material and a fluorinated polymer.

5. The organic photoelectronic element according to claim 1, wherein the refractive index in the wavelength range of from 450 nm to 800 nm, of the hole transport layer provided in contact with the light emitting layer, is at most 1.60.

6. The organic photoelectronic element according to claim 1, wherein the volume ratio of the content (A) of the fluorinated polymer to the content (B) of the organic semiconductor material in the hole transport layer is (A):(B) =from 70:30 to 5:95.

7. The organic photoelectronic element according to claim 1, wherein the refractive index in the wavelength range of from 450 nm to 800 nm, of the fluorinated polymer, is at most 1.5.

8. The organic photoelectronic element according to claim 1, wherein the fluorinated polymer is a perfluoropolymer having an aliphatic ring structure in the main chain.

9. The organic photoelectronic element according to claim 8, wherein the perfluoropolymer is polyperfluoro(3-butenyl vinyl ether).

10. The organic photoelectronic element according to claim 9, wherein the intrinsic viscosity of the polyperfluoro (3-butenyl vinyl ether) is from 0.01 to 0.14 dl/g.

11. The organic photoelectronic element according to claim 1, wherein the weight average molecular weight of the fluorinated polymer is from 1,500 to 50,000.

12. The organic photoelectronic element according to claim 1, wherein the organic photoelectronic element is an organic EL element.

13. The organic photoelectronic element according to claim 1, wherein the fluorinated polymer has a glass transition temperature (Tg) of at least 60° C.

* * * * *